(12) United States Patent
Zhang et al.

(10) Patent No.: US 12,218,150 B2
(45) Date of Patent: Feb. 4, 2025

(54) DISPLAY PANEL AND DISPLAY APPARATUS

(71) Applicant: Shanghai Tianma Micro-Electronics Co., Ltd., Shanghai (CN)

(72) Inventors: Hong Zhang, Shanghai (CN); Jian Zhao, Shanghai (CN); Zhidan Su, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 200 days.

(21) Appl. No.: 17/898,089

(22) Filed: Aug. 29, 2022

(65) Prior Publication Data
US 2023/0402464 A1   Dec. 14, 2023

(30) Foreign Application Priority Data
May 30, 2022   (CN) .......................... 202210597528.6

(51) Int. Cl.
*G02F 1/1333*  (2006.01)
*G02F 1/1345*  (2006.01)
*G02F 1/1362*  (2006.01)
*H01L 23/00*  (2006.01)
*H01L 27/12*  (2006.01)
*H01L 25/18*  (2023.01)

(52) U.S. Cl.
CPC ...... *H01L 27/124* (2013.01); *G02F 1/133382* (2013.01); *G02F 1/13452* (2013.01); *G02F 1/136286* (2013.01); *H01L 24/06* (2013.01); *H01L 25/18* (2013.01); *H01L 2224/06155* (2013.01)

(58) Field of Classification Search
CPC .................................................... G02F 1/1333
See application file for complete search history.

(56) References Cited

U.S. PATENT DOCUMENTS

2005/0285836 A1* 12/2005 Hwang ............... G02F 1/13452
345/93
2008/0316416 A1* 12/2008 Chang ................. G02F 1/13452
349/149

(Continued)

FOREIGN PATENT DOCUMENTS

| CN | 104461113 B | 12/2017 |
|---|---|---|
| CN | 114200703 A | 3/2022 |
| KR | 101024646 B1 | 3/2011 |

*Primary Examiner* — Sang V Nguyen
(74) *Attorney, Agent, or Firm* — Anova Law Group, PLLC

(57) ABSTRACT

A display panel and a display apparatus are provided in the present disclosure. The display panel includes a control chip in the non-display region on a first side, where the control chip is at least electrically connected to a data line; and along the second direction, the first side is adjacent to the display region; and includes a heating drive element in the non-display region on the first side, where the heating drive element is electrically connected to a heating wiring through a heating bus. The display panel further includes a gate drive element in the non-display region on a second side, where the gate drive element is electrically connected to a gate electrode line and electrically connected to the control chip through a first lead. Along a third direction, the heating bus is not overlapped with the first lead, where the third direction is perpendicular to the substrate.

23 Claims, 16 Drawing Sheets

(56) References Cited

U.S. PATENT DOCUMENTS

| | | | |
|---|---|---|---|
| 2018/0224688 A1* | 8/2018 | Chen .................... | G02F 1/13454 |
| 2020/0073168 A1* | 3/2020 | Zhao ................. | G02F 1/136286 |
| 2020/0201109 A1* | 6/2020 | Zhao ................. | G02F 1/133382 |
| 2023/0384630 A1* | 11/2023 | Su ..................... | G02F 1/133382 |

* cited by examiner

DISPLAY PANEL AND DISPLAY APPARATUS

CROSS-REFERENCE TO RELATED APPLICATION

This application claims the priority of Chinese Patent Application No. 202210597528.6, filed on May 30, 2022, the content of which is incorporated herein by reference in its entirety.

TECHNICAL FIELD

The present disclosure generally relates to the field of display technology and, more particularly, relates to a display panel and a display apparatus.

BACKGROUND

Liquid crystal is a special form of material, which not only has special crystal birefringence, but also has the fluidity of liquid. A liquid crystal display is a display apparatus fabricated using liquid crystal molecules to change their optical properties under the action of an external electric field. The liquid crystal displays have various types and have been widely used in various displays and electronic instruments. However, due to the limitation of liquid crystal materials, the response time of liquid crystal is increased at low temperatures. After the response time of liquid crystal is increased, the display quality may be poor, and dynamic images may have problems such as tailing and smearing, which may affect the visual effect. When the temperature drops further (below −30° C.), the alignment layer of the display apparatus may be destroyed, the liquid crystal state may disappear to become crystals, and the performance of the liquid crystal state may be lost, so that pictures may not be displayed.

Therefore, there is a need to effectively improve the display reliability of the display apparatus in a low temperature environment.

SUMMARY

One aspect of the present disclosure provides a display panel. The display panel includes a substrate, and a plurality of gate electrode lines, a plurality of data lines and a plurality of heating wirings which are at least in a display region of the display panel, where the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region; further includes a control chip, in the non-display region on a first side of the display panel, where the control chip is at least electrically connected to a data line of the plurality of data lines; and along the second direction, the first side is adjacent to the display region; further includes a heating drive element, in the non-display region on the first side, where the heating drive element is electrically connected to a heating wiring of the plurality of heating wirings through a heating bus; and further includes a gate drive element, in the non-display region on a second side of the display panel, where the second side is adjacent to the first side; and the gate drive element is electrically connected to a gate electrode line of the plurality of gate electrode lines and electrically connected to the control chip through a first lead. Along a third direction, the heating bus is not overlapped with the first lead, where the third direction is perpendicular to the substrate.

Another aspect of the present disclosure provides a display panel. The display panel includes a substrate, and a plurality of gate electrode lines, a plurality of data lines and a plurality of heating wirings which are at least in a display region of the display panel, where the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region; further includes a control chip, in the non-display region on a first side of the display panel, where the control chip is at least electrically connected to a data line of the plurality of data lines; and along the second direction, the first side is adjacent to the display region; further includes a heating drive element, in the non-display region on the first side, where the heating drive element is electrically connected to a heating wiring of the plurality of heating wirings through a heating bus; and further includes a gate drive element, in the non-display region on a second side of the display panel, where the second side is adjacent to the first side; and the gate drive element is electrically connected to a gate electrode line of the plurality of gate electrode lines and electrically connected to the control chip through a first lead. Along a third direction, the first lead and the heating bus are at least partially overlapped with each other to form an overlapped region; in the overlapped region, one of the first lead and the heating bus is hollowed out; and the third direction is perpendicular to a plane of the substrate.

Another aspect of the present disclosure provides a display apparatus including a display panel. The display panel includes a substrate, and a plurality of gate electrode lines, a plurality of data lines and a plurality of heating wirings which are at least in a display region of the display panel, where the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region; a control chip, in the non-display region on a first side of the display panel, where the control chip is at least electrically connected to a data line of the plurality of data lines; and along the second direction, the first side is adjacent to the display region; a heating drive element, in the non-display region on the first side, where the heating drive element is electrically connected to a heating wiring of the plurality of heating wirings through a heating bus; a gate drive element, in the non-display region on a second side of the display panel, where the second side is adjacent to the first side; and the gate drive element is electrically connected to a gate electrode line of the plurality of gate electrode lines and electrically connected to the control chip through a first lead, where along a third direction, the heating bus is not overlapped with the first lead, where the third direction is perpendicular to the substrate; and a flexible circuit board, where the flexible circuit board includes a heating line electrically connected to the heating drive element and a signal line electrically connected to the gate drive element; along a direction perpendicular to the flexible circuit board, the heating line is at least partially overlapped with the signal line; and at an overlapped position, the heating line and the signal line are separated by at least two insulating layers.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
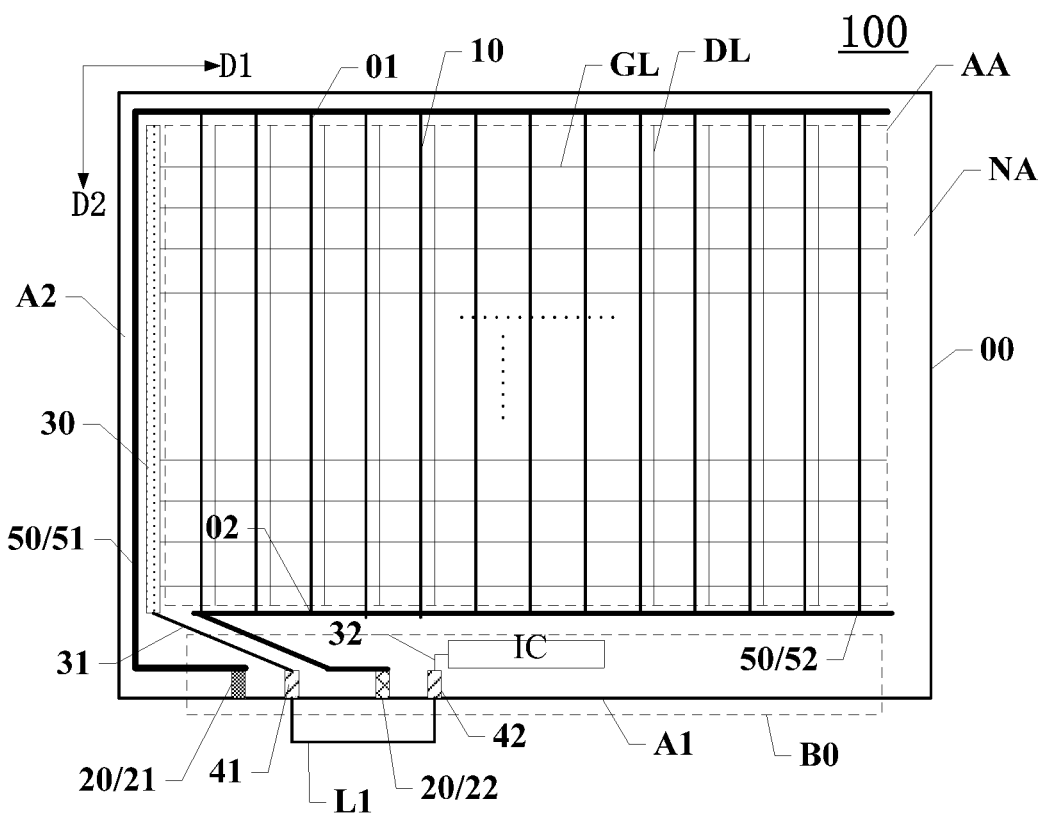
FIG. 1 illustrates a top view of a display panel according to various embodiments of the present disclosure.

Various exemplary embodiments of the present disclosure are be described in detail with reference to accompanying drawings. It should be noted that unless specifically stated otherwise, relative arrangement of components and steps, numerical expressions and numerical values described in these embodiments may not limit the scope of the present disclosure.

The following description of at least one exemplary embodiment may be merely illustrative and may not be used to limit the present disclosure and its application or use.

The technologies, methods, and apparatuses known to those skilled in the art may not be discussed in detail, but where appropriate, the technologies, methods, and apparatuses should be regarded as a part of the present disclosure.

In all examples shown and discussed herein, any specific value should be interpreted as merely exemplary, rather than as a limitation. Therefore, other examples in exemplary embodiment may have different values.

It is obvious to those skilled in the art that various modifications and variations can be made in the present disclosure without departing from the spirit or scope of the present disclosure. Accordingly, the present disclosure may be intended to cover modifications and variations of the present disclosure that fall within the scope of corresponding claims (claimed technical solutions) and their equivalents. It should be noted that implementation manners provided in embodiments of the present disclosure may be combined with each other if there are no conflicts.

It should be noted that similar reference numerals and letters are used to indicate similar items in following drawings. Therefore, once an item is defined in one drawing, it does not need to be further discussed in subsequent drawings.

FIG. 1 illustrates a top view of a display panel according to various embodiments of the present disclosure. Referring to FIG. 1, embodiments of the present disclosure provide a display panel 100. The display panel 100 may include a substrate 00, and a plurality of gate electrode lines GL, a plurality of data lines DL and a plurality of heating wirings 10 at least in a display region AA of the display panel 100. The gate electrode lines GL may extend along the first direction D1 and be arranged along the second direction D2, the data lines DL may extend along the second direction D2 and be arranged along the first direction D1, and the first direction D1 may intersect the second direction D2. The display panel 100 may further include a non-display region NA at least partially surrounding the display region AA.

The display panel may further include a control chip IC in the non-display region NA of the first side A1 of the display panel 100. The control chip IC may be at least electrically connected to the data line DL; and along the second direction D2, the first side A1 may be adjacent to the display region AA.

The display panel may further include a heating drive element 20 in the non-display region NA of the first side A1. The heating drive element 20 may be electrically connected to the heating wiring 10 through a heating bus 50.

The display panel may further include a gate drive element 30 in the non-display region NA of the second side A2 of the display panel 100. The second side A2 may be adjacent to the first side A1. The gate drive element 30 may be electrically connected to the gate electrode line GL and also may be electrically connected to the control chip IC through a first lead 31.

Along the third direction, the heating bus 50 may not be overlapped with the first lead 31, and the third direction may be perpendicular to the substrate 00.

It can be understood that the display panel 100 of the rectangular structure may be taken as an example in FIG. 1 to illustrate the display panel in the present disclosure, which may not limit actual shapes of the display panel. In some other embodiments of the present disclosure, the display panel may also be embodied in other shapes than rectangles, such as circular, oval or non-rectangular special-shaped structures.

Figure 2:
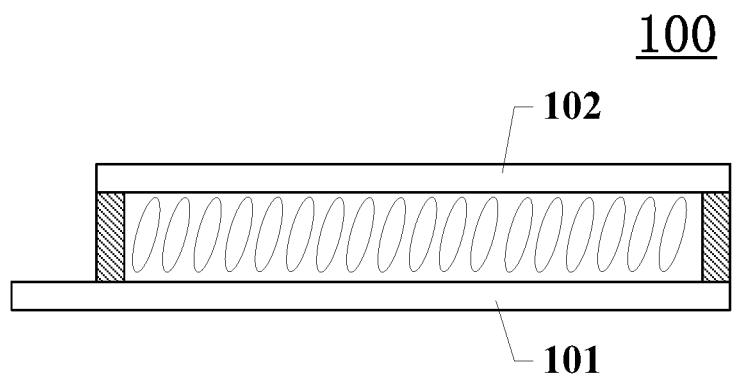
FIG. 2 illustrates a schematic of film layers according to various embodiments of the present disclosure.

Optionally, the display panel 100 provided by embodiments of the present disclosure may be a liquid crystal display panel. FIG. 2 illustrates a schematic of film layers according to various embodiments of the present disclosure. The display panel 100 may include an array substrate 101 and a color filter substrate 102 which are disposed opposite to each other and include liquid crystal molecules disposed between the array substrate 101 and the color filter substrate 102. The heating wiring 10 provided in embodiments of the present disclosure may be disposed on the array substrate 101, also be disposed on the color filter substrate 102, and also be disposed simultaneously on the array substrate 101 and the color filter substrate 102. All of these configuration manners may play a role in heating the liquid crystal in a low temperature environment, thereby meeting usage requirements of the display panel 100 in a low temperature environment.

FIG. 1 illustrates gate electrode lines GL and data lines DL on the display panel 100. Optionally, a region defined by two adjacent gate electrode lines GL and two adjacent data lines DL may be a pixel region. When the gate electrode line GL provides a conduction signal to the pixel region, the liquid crystal molecules corresponding to the pixel region may be deflected in response to the signal on the data line DL, thereby realizing the image display function of the display panel 100.

Referring to FIG. 1, in embodiments of the present disclosure, the heating wiring 10 may be introduced into the display panel 100. Compared with the method of disposing a heater outside the display panel 100 in the existing technology, the heating wiring 10 may be closer to the liquid crystal molecules. In a low temperature display stage, the heating wiring 10 may be configured to heat the liquid crystal molecules in the display panel 100. For example, a DC voltage may be provided to the heating wiring 10 through the heating bus 50; and the temperature of the heating wiring 10 may increase under the action of the DC voltage. The heat of the heating wirings 10 may directly act on the liquid crystal molecules to heat the liquid crystal molecules in the display panel 100, which may be beneficial for improving the heating speed and meeting normal use requirements of display products in a low temperature environment. Moreover, the structure of the product may be greatly simplified compared to the solution of additionally introducing the heater in the existing technology. In addition, in a low temperature environment, the display panel 100 may be continuously heated as required to keep the liquid crystal molecules at a suitable working temperature to reduce viscous resistance, which may improve the state change speed of the liquid crystal molecules and be also beneficial for improving the smearing phenomenon of the displayed image and improving the display quality of the product.

Optionally, the non-display region NA of the first side A1 of the display panel 100 mentioned in embodiments of the present disclosure may be, for example, a lower border region of the display panel 100; and the non-display region NA of the second side A2 of the display panel 100 may be, for example, a left border region and/or a right border region of the display panel 100.

In the display panel 100 provided by embodiments of the present disclosure, the control chip IC and the heating drive element 20 may be both in the non-display region NA of the first side A1 of the display panel 100, such that the heating bus 50 led out from the heating drive element 20 may be electrically connected with the heating wiring 10 in the display region AA. The gate drive element 30 may be in the non-display region NA of the second side A2 of the display panel 100, and the first lead 31 led out from the gate drive element 30 may be electrically connected to the control chip IC. A part of the first lead 31 and a part of the heating bus 50 may be both in the non-display region NA of the first side A1 of the display panel 100. If in the non-display region NA of the first side A1, the heating bus 50 and the first lead 31 may be overlapped with each other, parasitic capacitance may be generated in the overlapped region. In a low temperature environment, when a heating drive signal is provided to the heating wiring 10 through the heating bus 50, the change of the heating drive signal, such as at the moment when the heating drive signal is turned on and off, may cause the signal on the first lead 31 to change due to coupling, and the signal transmitted to the gate drive element 30 may be an unexpected signal, which may result in the risk of abnormal display. In addition, if the overlapped region of the heating bus 50 and the first lead 31 is relatively large and the thickness of the insulating layer therebetween is relatively thin, the risk of short circuit may be very likely to occur.

In order to solve above problems, in embodiments of the present disclosure, after the heating bus 50 is disposed into the display panel 100, it is defined that the heating bus 50 and the first lead 31 led out from the gate driver may not be overlapped with each along the third direction, which may be beneficial for avoiding the generation of coupling capacitance between the heating bus 50 and the first lead 31, also avoiding the influence of the heating drive signal on the signal on the first lead 31, and also avoiding the phenomenon of short circuit between the heating bus 50 and the first lead 31. Therefore, while realizing the heating of the display panel 100 in a low temperature environment, it is also beneficial for ensuring the accuracy of the signals transmitted by the gate drive element 30 in the display panel 100, thereby improving the display reliability of the product.

It can be understood that the heating wirings 10 shown in FIG. 1 may be exemplary and may not represent the number of heating wirings 10 actually included in the display panel 100.

Optionally, in the display panel 100 provided by embodiments of the present disclosure, the heating bus 50 may be in the non-display region NA of the display panel 100, thereby avoiding the introduction of the heating bus 50 from affecting the screen ratio of the display panel 100.

It should be noted that, in one embodiment, the solution that the control chip IC is on the substrate of the display panel 100 may be taken as an example for description in FIG. 1, which may not limit the actual position of the control chip IC. In some other embodiments of the present disclosure, the control chip IC may also be on the flexible circuit board; and this solution is described in subsequent embodiments.

In an exemplary embodiment of the present disclosure, on the first side A1, the minimum distance between the orthographic projections of the first lead 31 and the heating bus 50 to the substrate 00 is D0, where D0≥10 μm.

As shown in FIG. 1, when the heating bus 50 is introduced into the display panel 100, in the non-display region NA of the first side A1, the orthographic projection of the heating bus 50 and the first lead 31 on the substrate 00 may not be in a parallel relationship; and in the orthographic projections on the substrate 00, the distance between partial line segments of the heating bus 50 and the first lead 31 may be relatively small, and the distance between partial line segments may be relatively large. When the minimum distance between the orthographic projections of the first lead 31 and the heating bus 50 on the substrate 00 is less than 10 μm, the distance between the first lead 31 and the heating bus 50 may be relatively small, and the fluctuation in the heating drive signals on the heating bus 50 may be likely to cause fluctuation in the signals on the first lead 31. Therefore, in the present disclosure, it defines that the minimum distance between the orthographic projections of the first lead 31 and the heating bus 50 on the substrate 00≥10 μm. While maintaining a certain distance between the first lead 31 and the heating bus 50, the influence of the fluctuation of the heating drive signal of the heating bus 50 on the signal of the first lead 31 may be effectively avoided or reduced, which may be more beneficial for improving the display reliability of the display panel 100 in a low temperature environment.

Referring to FIG. 1, in an exemplary embodiment of the present disclosure, the display panel 100 may further include a first connection lead L1. The gate drive element 30 may be electrically connected to the first connection lead L1 through the first lead 31, and the control chip IC may be electrically connected to the first connection lead L1 through a second lead 32.

Considering that the gate drive element 30 needs to be electrically connected with the control chip IC to obtain a corresponding signal from the control chip IC, when the orthographic projections of the heating bus 50 and the first lead 31 on the substrate 00 do not be overlapped with each other in embodiments of the present disclosure, the first lead 31 may not be directly wired to the position where the control chip IC is to form an electrical connection with the control chip IC. Therefore, in embodiments of the present disclosure, the first connection lead L1 may be introduced, such that the first lead 31 led out from the gate drive element 30 may be electrically connected with the first connection lead L1 and the control chip IC may be electrically connected with the first connection lead L1 through the second lead 32. Therefore, the electrical connection between the gate drive element 30 and the control chip IC may be realized, and the orthographic projections of the first lead 31 and the heating bus 50 may be avoided to be overlapped with each other, thereby ensuring low-temperature display reliability. In addition, in embodiments of the present disclosure, without introducing a complex structure, the electrical connection between the gate drive element 30 and the control chip IC may be realized by introducing the first connection lead L1, which may also be beneficial for simplifying overall structure of the display panel 100.

Figure 3:
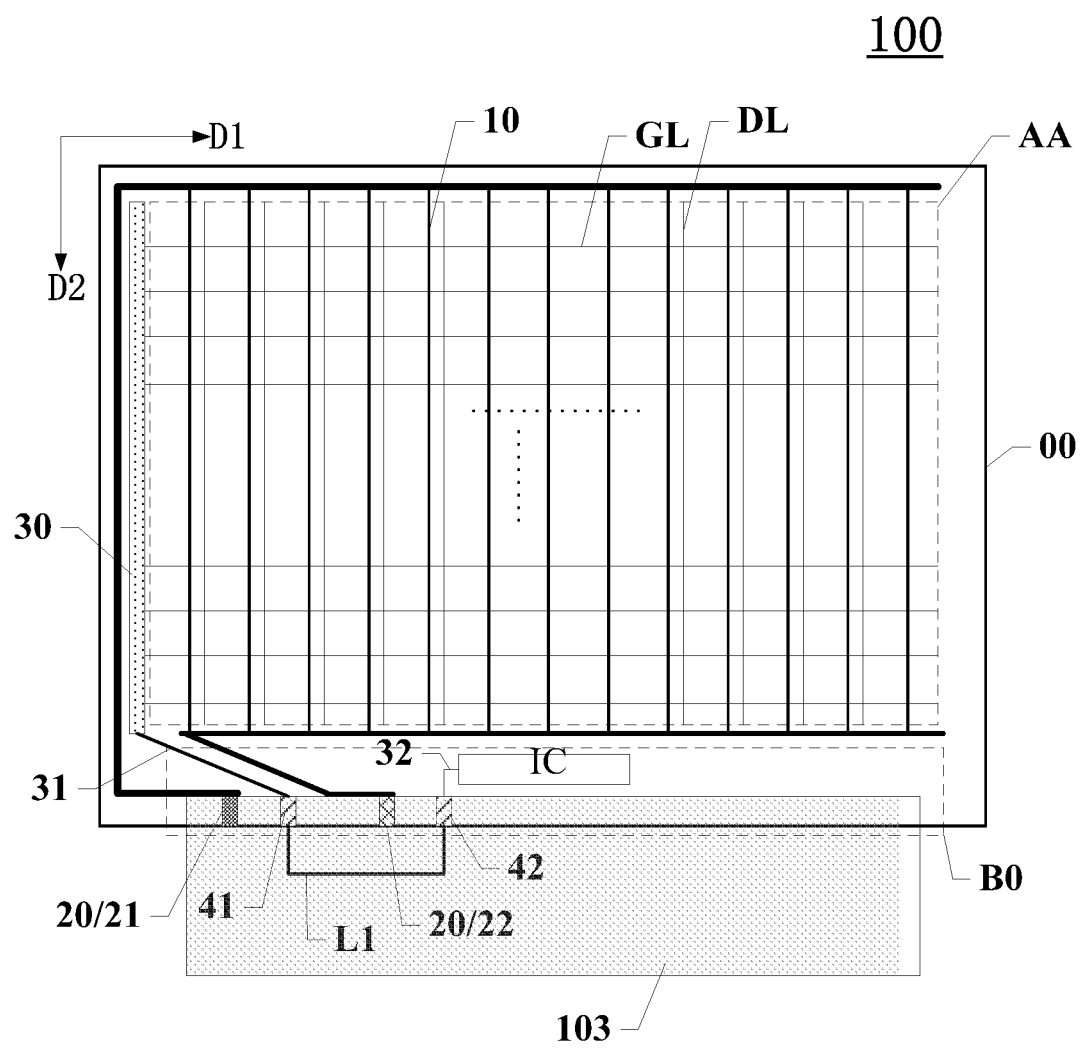
FIG. 3 illustrates another top view of a display panel according to various embodiments of the present disclosure.

FIG. 3 illustrates another top view of a display panel according to various embodiments of the present disclosure. Referring to FIGS. 1 and 3, in an exemplary embodiment of the present disclosure, the display panel 100 may further include a binding region B0 on the first side A1 and a flexible circuit board 103 electrically connected to the binding region B0; and the first connection lead L1 may be on the flexible circuit board 103. The binding region B0 may include a first connection soldering pad 41 and a second connection soldering pad 42; the gate drive element 30 may be electrically connected to the first connection soldering pad 41 through the first lead 31; and the control chip IC may be electrically connected to the second connection soldering pad 42 through the second lead 32. Both ends of the first connection lead L1 on the flexible circuit board 103 may be electrically connected to the first connection soldering pad 41 and the second connection soldering pad 42 respectively.

In one embodiment, it describes a positional relationship between the flexible circuit board 103 and the first connection lead L1 when the flexible circuit board 103 is introduced into the display panel 100. For example, after the flexible circuit board 103 is introduced into the display panel 100, the flexible circuit board 103 may be bound to the binding region B0; and the binding region B0 may be disposed with the first connection soldering pad 41 and the second connection soldering pad 42. In embodiments of the present disclosure, the first connection lead L1 may be disposed on the flexible circuit board 103, and both ends of the first connection lead L1 on the flexible circuit board 103 may be electrically connected to the first connection soldering pad 41 and the second connection soldering pad 42, respectively. The first lead 31 led from the gate drive element 30 may be electrically connected to the first connection soldering pad 41 of the binding region B0; and the second lead 32 led from the control chip IC may be electrically connected to the second connection soldering pad 42 of the binding region B0. Therefore, the electrical connection between the gate drive element 30 and the control chip IC may be realized through the first connection lead L1 on the flexible circuit board 103. Optionally, after the flexible circuit board 103 is bound to the binding region B0, the part which is not bound to the binding region B0 may be folded back to the non-light-emitting surface of the display panel 100. Therefore, after the first connection lead L1 is disposed on the flexible circuit board 103, it is not necessary to occupy the space of the non-display region NA on the side of the display panel 100, which may be beneficial for realizing narrow frame design.

Figure 4:
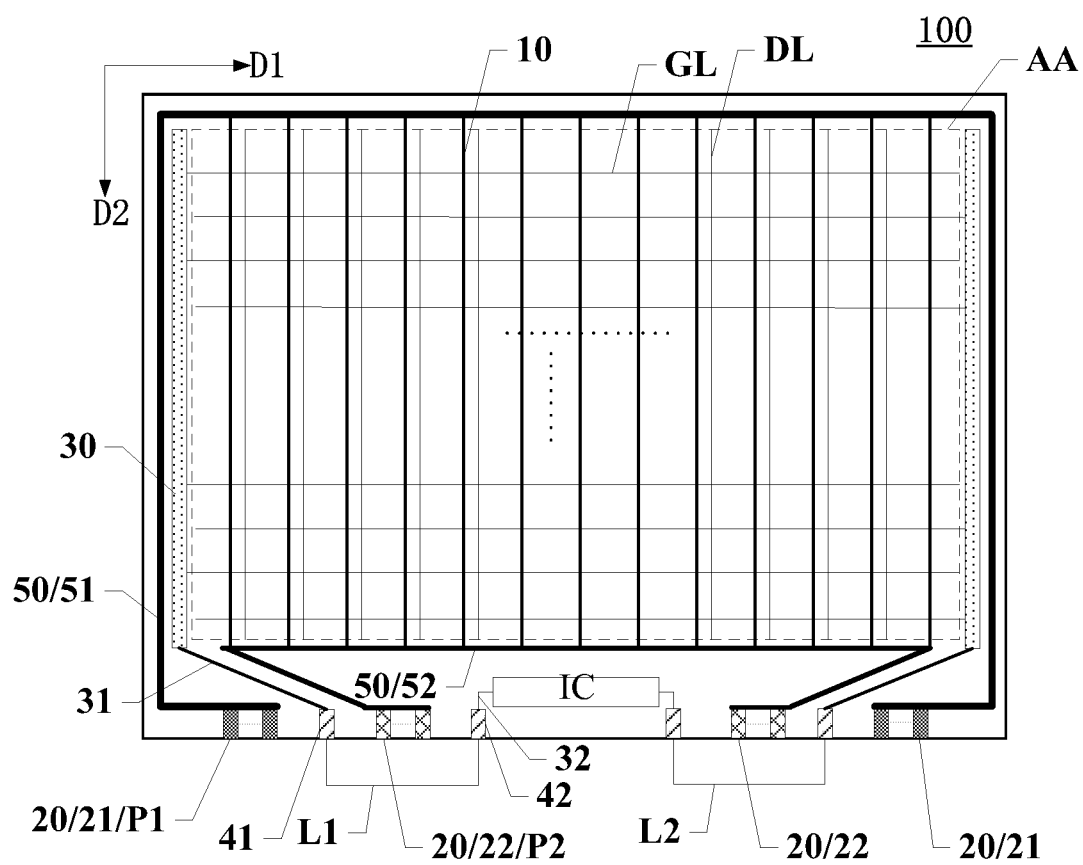
FIG. 4 illustrates another top view of a display panel according to various embodiments of the present disclosure.
Figure 5:
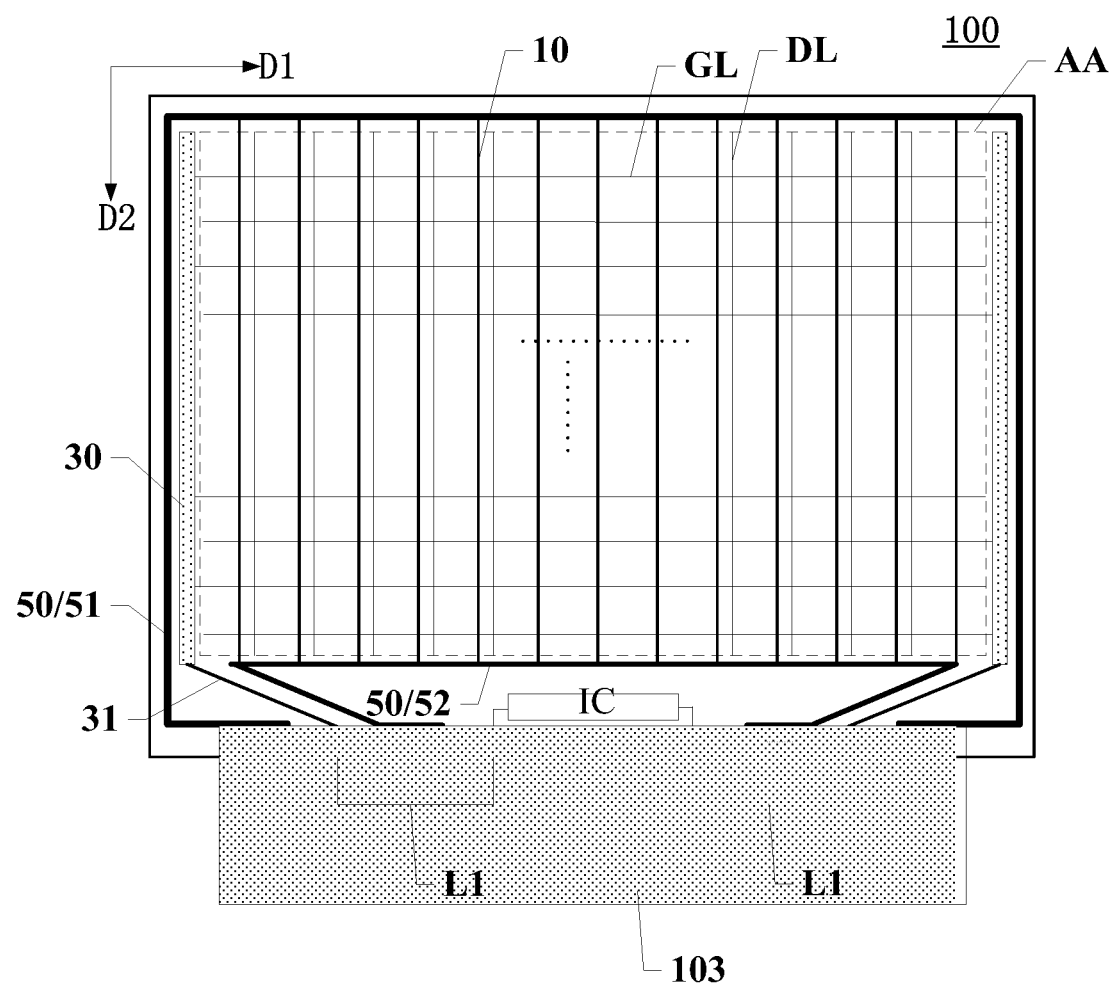
FIG. 5 illustrates a top view of a display panel after a flexible circuit board is disposed on the display panel of FIG. 4.

Referring to FIGS. 4 and 5, FIG. 4 illustrates another top view of a display panel according to various embodiments of the present disclosure; and FIG. 5 illustrates a top view after a flexible circuit board is disposed on a display panel of FIG. 4. In an exemplary embodiment of the present disclosure, the control chip IC and the heating drive elements 20 may be all in the binding region B0; along the first direction D1, the heating drive elements 20 may be on two sides of the control chip IC.

Optionally, in the binding region B0 included in the non-display region NA of the first side A1 of the display panel 100, a part of the region may be used for binding the control chip IC, and another part of the region may be used for binding the flexible circuit board 103. In embodiments of the present disclosure, when the heating drive element 20 is disposed in the binding region B0, the heating drive element 20 may be electrically connected with the flexible circuit board 103; furthermore, the heating drive element 20 may be electrically connected to an external circuit through the flexible circuit board 103, the heating drive signal may be provided to the heating drive element 20 through the external circuit, and the heating signal may be transmitted to each heating wiring 10 through the heating bus 50. When the heating drive element 20, the first connection soldering pads 41 and the second connection soldering pads 42 are all disposed in the binding region B0, the heating drive element 20, the first connection soldering pad 41 and the second connection soldering pad 42 may be bound to a same flexible circuit board 103, thereby being beneficial for reducing the number of flexible circuit boards 103 included in the display panel 100 and simplifying the overall structure of the display panel 100.

In addition, the heating drive elements 20 are arranged on two sides of the control chip IC in embodiments of the present disclosure. In such way, on the one hand, the electrical connection between the control chip IC and the data line DL may be convenient; on the other hand, the electrical connection between the heating bus 50 and the heating wirings 10 in different regions may also be convenient, thereby ensuring display reliability and heating reliability.

Optionally, referring to FIGS. 4-5, a same heating bus 50 may be electrically connected to the heating drive elements 20 on two sides of the control chip IC, respectively. The heating drive elements 20 on two sides may provide heating drive signals to the heating bus 50 simultaneously, which may be beneficial for improving the driving capability of the heating bus 50; and more effective power may be transmitted to the heating wiring, which may be beneficial for improving the heating efficiency of the display panel in a low temperature environment.

Figure 6:
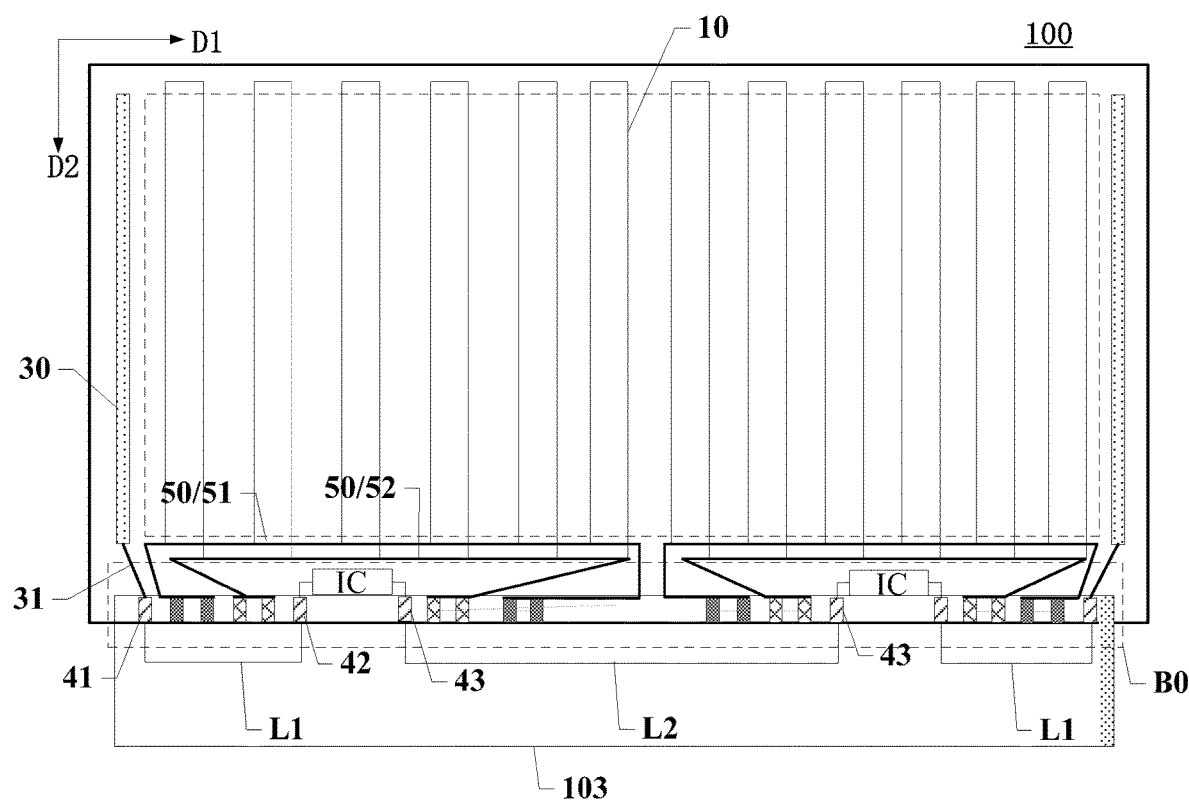
FIG. 6 illustrates another top view of a display panel according to various embodiments of the present disclosure.

In above-mentioned embodiments, it describes the solution that the display panel 100 may be disposed with the control chip IC. In some other implementations of the present disclosure, the display panel 100 may further include two or more control chips ICs, for example, as shown in FIG. 6. FIG. 6 illustrates another top view of a display panel according to various embodiments of the present disclosure. When the size of the display panel 100 is relatively large, for example, when the length and width of the display panel 100 are relatively large, the gate electrode lines may be relatively long, and the number of data lines may be relatively large. It is difficult for a single control chip IC to effectively drive the display panel for display. At this point, two or more control chips ICs may be disposed in the display panel 100 to satisfy the normal display requirement of the large-size display panel 100. Optionally, in one embodiment, the display panel 100 including two control chips ICs may be taken as an example as shown in FIG. 6. In some other embodiments of the present disclosure, the number of control chips ICs included in the display panel 100 may also be three or more, which may not be limited in the present disclosure.

Referring to FIG. 6, in an exemplary embodiment of the present disclosure, the number of control chips ICs is n, where n≥2. In the binding region B0, the control chips ICs may be arranged along the first direction D1. The binding region B0 may further include third connection soldering pads 43 corresponding to the number of control chips ICs, and the flexible circuit board 103 may further include second connection leads L2. The control chip IC may be electrically connected to the third connection soldering pad 43 through the third lead. The third connection soldering pads 43 corresponding to two adjacent control chips ICs may be electrically connected through the second connection leads L2 on the flexible circuit board 103.

When at least two control chips ICs are introduced into the display panel 100 to drive the display panel 100, for example, different control chips ICs may provide data signals to the data lines DL in different regions. Considering that different regions in the display region AA jointly display images, signal connection may need to be established between multiple control chips ICs. In embodiments of the present disclosure, the third connection soldering pad 43 corresponding to the number of control chips ICs may be introduced into the binding region B0, the second connection lead L2 may be introduced into the flexible circuit board 103, both ends of a same second connection lead L2 may be respectively connected to different third connection soldering pads 43, and each control chip IC may be connected to the third connection soldering pad 43 through the second connection lead L2, respectively. In such way, the electrical connection may be formed between two adjacent control chips ICs through the second connection lead L2 on the flexible circuit board 103, thereby realizing signal connection between the control chips ICs. In addition, by arranging the second connection lead L2 on the flexible circuit board 103, the second connection lead L2 may not need to occupy the frame space of the first side A1 of the display panel 100, which may be beneficial to realize the narrow frame design of the display panel 100. Moreover, when the second connection lead L2 connecting two control chips ICs is arranged on the flexible circuit board 103, the second connection lead L2 may not be overlapped with the heating bus 50. Therefore, the signal change on the heating bus 50 may not cause interference to the signal of the second connection lead L2, which may be beneficial for improving the stability and accuracy of the signals transmitted by the control chip IC.

Figure 7:
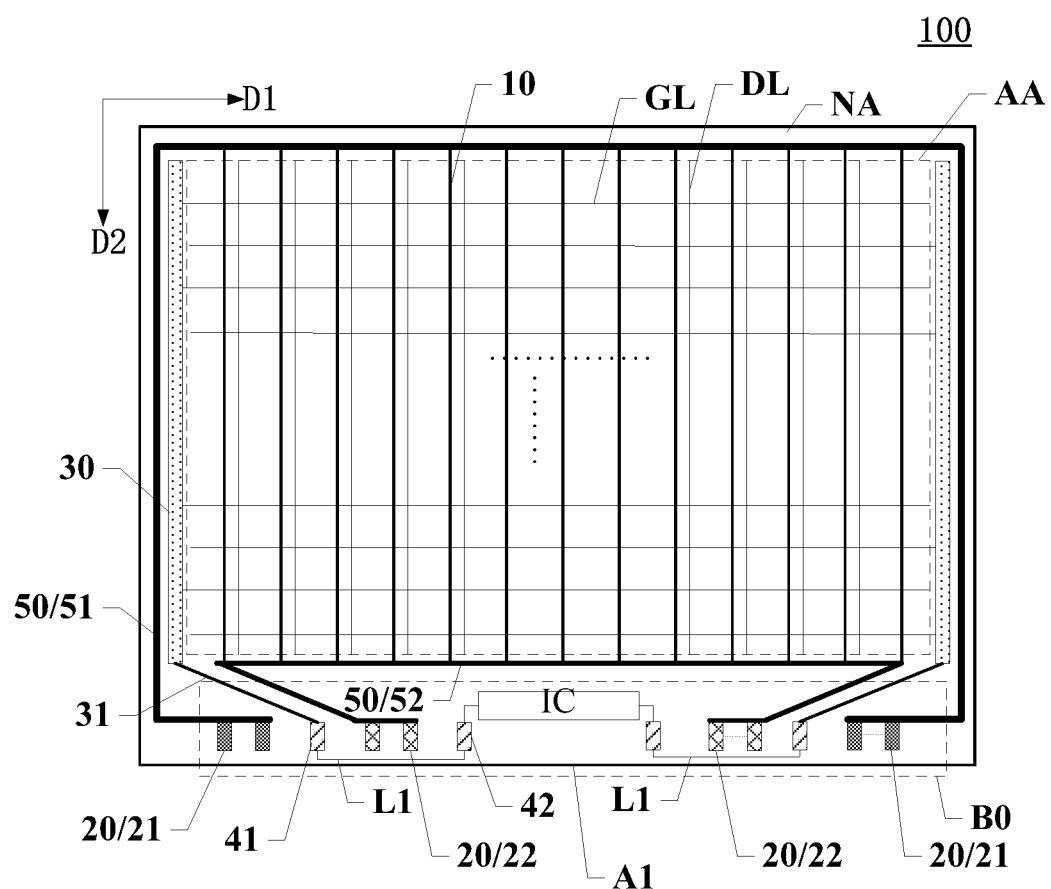
FIG. 7 illustrates another top view of a display panel according to various embodiments of the present disclosure.

FIG. 7 illustrates another top view of the display panel 100 according to various embodiments of the present disclosure. In an exemplary embodiment of the present disclosure, the display panel 100 may include the binding region B0 on the first side A1, both the control chip IC and the heating drive element 20 may be in the binding region B0, the first connection lead L1 may be in the non-display region NA of the first side A1 of the display panel 100 and on the side of the binding region B0 away from the display region AA.

For example, in one embodiment shown in FIG. 7, it describes a solution that the first connection lead L1 may be disposed in the non-display region NA of the first side A1 of the display panel 100 and disposed on the substrate 00 of the display panel 100. In such solution, the first connection lead L1 may not be disposed on the flexible circuit board 103. Optionally, the first connection lead L1 is on the side of the binding region B0 away from the display region AA, which may realize the electrical connection between the gate drive element 30 and the control chip IC and prevent the first connection lead L1 from being overlapped with other wiring on the display panel 100, for example, prevent the first connection lead L1 from being overlapped with the heating bus 50. Therefore, it avoids that the signal change on the heating bus 50 interferes with the signal on the first connection lead L1, which may be beneficial for improving the stability and accuracy of the signals transmitted by the control chip IC. Furthermore, the solution of disposing the first connection lead L1 on the substrate 00 of the display panel 100 may not need to occupy the space of the flexible circuit board, which may reduce the size of the flexible circuit board to a certain extent.

Above-mentioned implementation illustrates a solution that the control chip IC may be disposed in the non-display region NA of the first side A1 of the display panel 100 and disposed on the substrate 00 of the display panel 100, which belongs to the COG (Chip on Glass) structure. In some other embodiments of the present disclosure, a COF (Chip on FPC) structure may also be used, that is, the control chip IC may be disposed on the flexible circuit board 103. For example, as shown in FIG. 8, FIG. 8 illustrates another top view of the display panel 100 according to various embodiments of the present disclosure.

Figure 8:
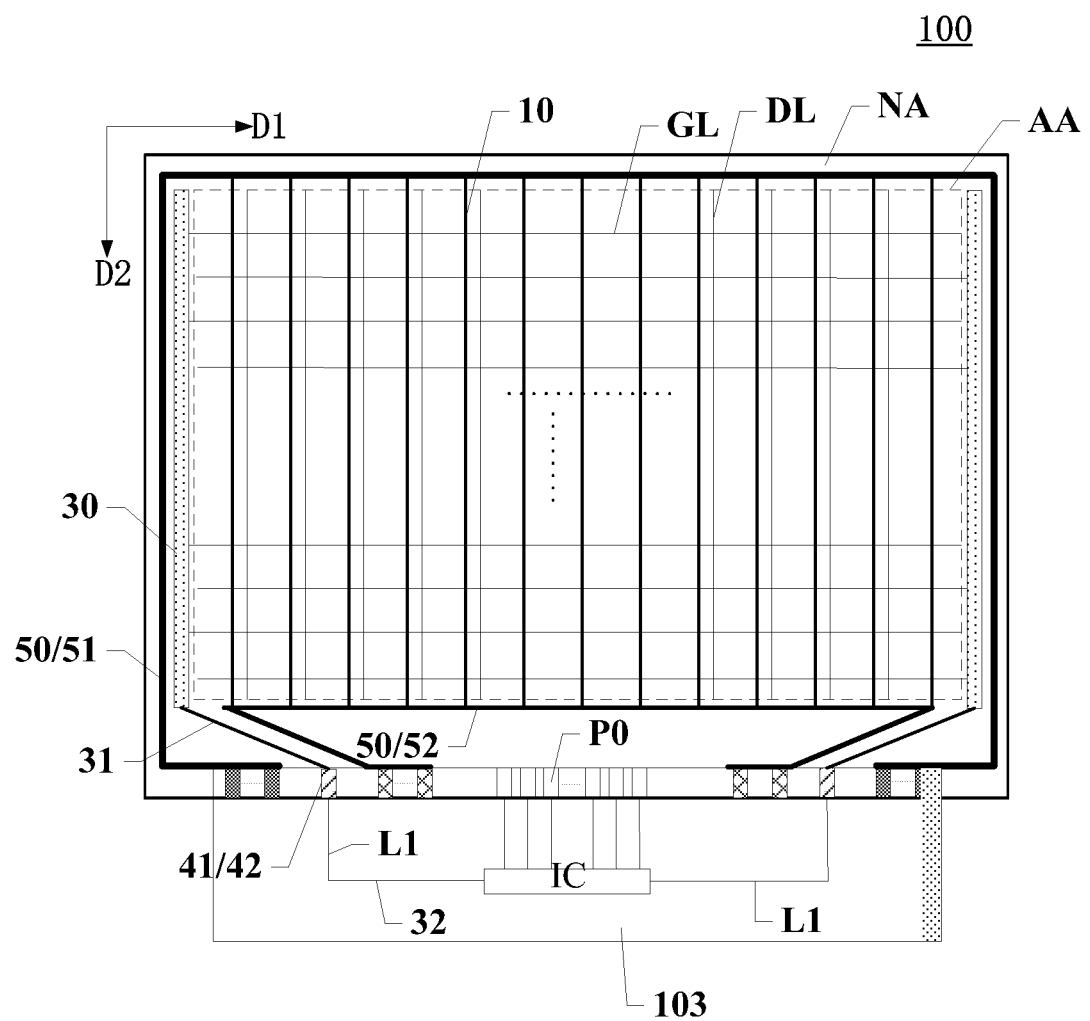
FIG. 8 illustrates another top view of a display panel according to various embodiments of the present disclosure.

Referring to FIG. 8, in an exemplary embodiment of the present disclosure, the display panel 100 may include the binding region B0 on the first side A1 and the flexible circuit board 103 electrically connected to the binding region B0, the binding region B0 may include a plurality of first conductive soldering pads P0, and the first conductive soldering pad P0 may be at least electrically connected to the data line DL; the first connection lead L1 and the second lead 32 may be on the flexible circuit board 103, the control chip IC may be on the flexible circuit board 103 and electrically connected to at least the first conductive soldering pad P0; and the first lead 31 may be on the display panel 100.

The binding region B0 may include the first connection soldering pad 41; the flexible circuit board 103 may include the second connection soldering pad 42 electrically connected to the first connection soldering pad 41; on the flexible circuit board 103, the second connection soldering pad 42 is electrically connected to the first connection lead L1; and the gate drive element 30 may be electrically connected to the first connection soldering pad 41 through the first lead 31.

For example, in embodiments of the present disclosure, the binding region B0 may be disposed in the non-display region NA of the first side A1 of the display panel 100; the plurality of first conductive soldering pads P0 may be disposed in the binding region B0; the first conductive soldering pad P0 may be configured for electrical connection with the control chip IC and for electrical connection with the gate electrode line GL and/or the data line DL; and the control chip IC may provide a scan signal to the gate electrode line GL through the first conductive soldering pad P0, and/or provide a data signal to the data line DL, thereby realizing driving the liquid crystal molecules. In one embodiment, the flexible circuit board 103 may be bound to the binding region B0, and the control chip IC may be disposed on the flexible circuit board 103, so that the control chip IC may not occupy the frame space of the display panel 100, thereby being beneficial for realizing narrow frame design.

When the control chip IC is disposed on the flexible circuit board 103, both the first connection lead L1 and the second lead 32 led from the control chip IC may be disposed on the flexible circuit board 103 in the present disclosure. The control chip IC may be electrically connected to the first connection lead L1 through the second lead 32, and the first connection lead L1 may be further electrically connected to the second connection soldering pad 42 on the flexible circuit board 103. The first lead 31 led out from the gate drive element 30 may be electrically connected to the first connection soldering pad 41 of the binding region B0. When the flexible circuit board 103 is bound to the binding region B0, the first connection soldering pad 41 may be electrically connected to the second connection soldering pad 42 on the flexible circuit board 103. In such way, the gate drive element 30, the first lead 31, the first connection soldering pad 41, the second connection soldering pad 42, the first connection lead L1, the second lead 32 and the control chip IC may be electrically connected in sequence, thereby realizing the electrical connection between the gate drive element 30 and the control chip IC.

Figure 9:
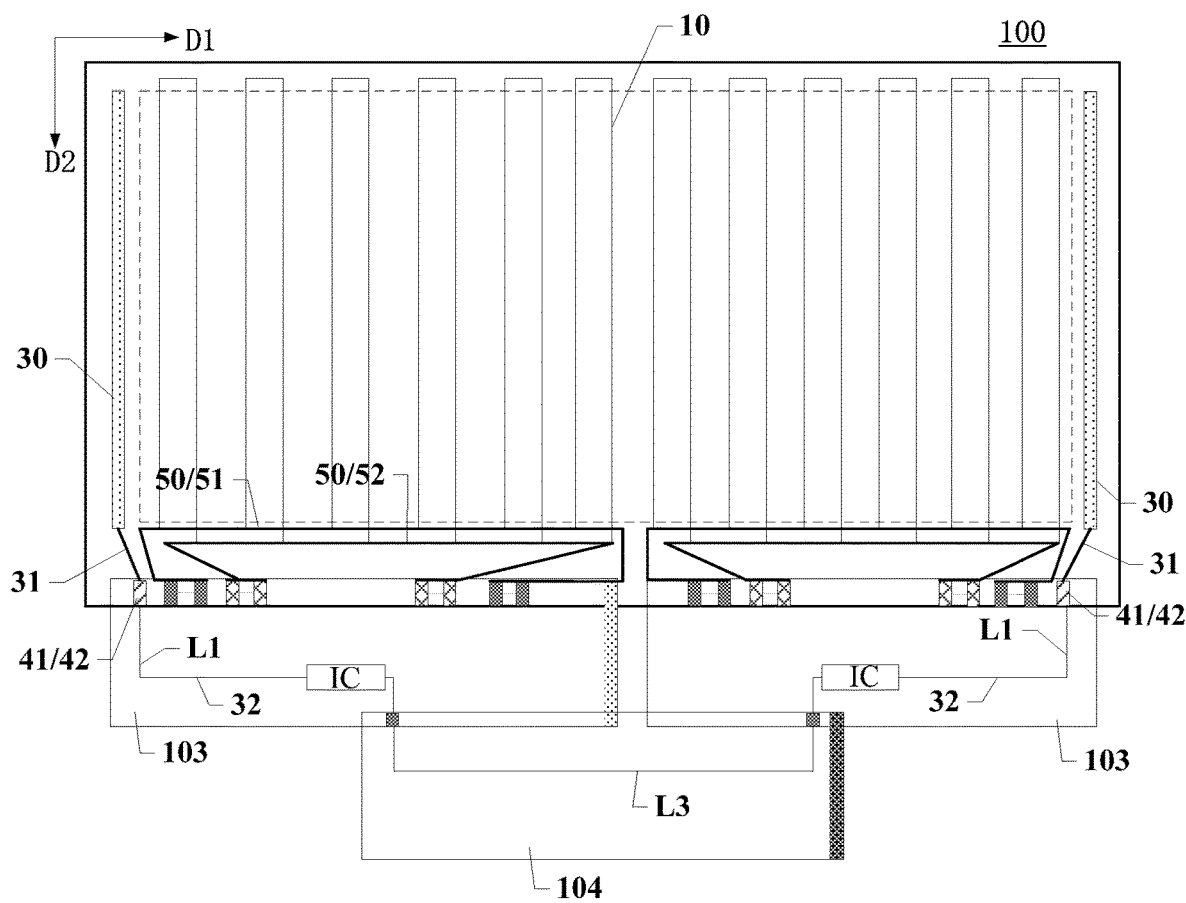
FIG. 9 illustrates another top view of a display panel according to various embodiments of the present disclosure.

In one embodiment of FIG. 8, it describes a solution that only one control chip IC may be included in the display panel 100 when the COF structure is used. In some other implementations of the present disclosure, the display panel 100 corresponding to the COF structure may further include two or more control chips ICs. For example, as shown in FIG. 9, FIG. 9 illustrates another top view of the display panel 100 according to various embodiments of the present disclosure. When the size of the display panel 100 is relatively large, for example, the length and width of the display panel 100 are relatively large, the gate electrode lines may be relatively long, and the number of data lines may be relatively large. It is difficult for a single control chip IC to effectively drive the display panel 100 for display. Therefore, two or two control chips ICs may be disposed in the display panel 100 to satisfy normal display requirement of the large-sized display panel 100. In one embodiment of FIG. 9, it describes the solution that two flexible circuit boards 103 may be included in the display panel 100, and one control chip IC may be respectively disposed on two flexible circuit boards 103. In some other embodiments of the present disclosure, the number of the flexible circuit boards 103 and the control chips ICs included in the display panel 100 of the COF structure may be other numbers, which may not be limited in the present disclosure.

Referring to FIG. 9, in an exemplary embodiment of the present disclosure, the display panel 100 may further include a printed circuit board 104; and the number of flexible circuit boards 103 is m, where m≥2. The control chips ICs on different flexible circuit boards 103 may be electrically connected through a third connection lead L3 on the printed circuit board 104.

When at least two control chips ICs are introduced into the display panel 100 to drive the display panel 100, different control chips ICs may, for example, provide data signals to the data lines DL in different regions. Considering that different regions in the display region AA jointly display images, it is necessary to establish signal connections between multiple control chips ICs. When the COF structure is used to dispose the control chip IC on the flexible circuit board 103, the printed circuit board 104 may be introduced in embodiments of the present disclosure; the printed circuit board 104 may be electrically connected to two adjacent flexible circuit boards 103, respectively; the third connection lead L3 may be introduced on the printed circuit board 104, and the control chips ICs on two adjacent flexible circuit boards 103 may be electrically connected to the third connection lead L3 respectively, such that the signal connection of two adjacent control chips ICs may be realized. In addition, when the third connection lead L3 connecting two control chips ICs is disposed on the printed circuit board 104, the third connection lead L3 may not be overlapped with the heating bus 50. Therefore, the signal change on the heating bus 50 may not cause interference to the signal of the third connection lead L3, which may be beneficial for improving the stability and accuracy of the signal transmitted by the control chip IC.

Referring to FIG. 1, in an exemplary embodiment of the present disclosure, the heating drive element 20 may include a first voltage terminal 21 and a second voltage terminal 22, and the heating bus 50 may include a first heating bus 51 connected to the first voltage terminal 21 and a second heating bus 52 connected to the second voltage terminal 22; the display panel 100 may further include the binding region B0 on the first side A1, and the binding region B0 may include the first connection soldering pad 41 electrically connected to the gate drive element 30 and the second connection soldering pad 42 electrically connected to the control chip IC; and in the binding region B0, along the first direction D1, the first connection soldering pad 41 may be between the first voltage terminal 21 and the second voltage terminal 22, and the first lead 31 may be between the first heating bus 51 and the second heating bus 52.

Optionally, the heating bus 50 provided in embodiments of the present disclosure may include the first heating bus 51 that provides a first heating drive signal to the heating wiring 10 and include the second heating bus 52 that provides a second heating drive signal to the heating wiring 10. In embodiments of the present disclosure, the first lead 31 and the heating bus 50 may not be overlapped with each other along the third direction, which may refer that along the third direction, the first lead 31 may not be overlapped with the first heating bus 51 and also may not be overlapped with the second heating bus 52.

In one embodiment, it describes an arrangement manner of the first voltage terminal 21, the second voltage terminal 22 and the first connection soldering pad 41 in order to prevent the first lead 31 from being overlapped with the first heating bus 51 and the second heating bus 52. For example, the first voltage terminal 21 may be a voltage terminal connected to the first heating bus 51, the second voltage terminal 22 may be a voltage terminal connected to the second heating bus 52, and the first connection soldering pad 41 may be a pad connected to the first lead 31. In one embodiment, the first connection soldering pad 41 may be disposed between the first voltage terminal 21 and the second voltage terminal 22; and the first lead 31 may be between the first heating bus 51 and the second heating bus 52. Such arrangement may not only simplify the wiring complexity on the display panel 100, but also avoid that the orthographic projection of the first lead 31 on the substrate 00 is overlapped with the orthographic projections of the first heating bus 51 and the second heating bus 52 on the substrate 00, thereby ensuring the reliability of low temperature display. In addition, the first connection soldering pad 41, the second connection soldering pad 42, the first voltage terminal 21 and the second voltage terminal 22 may all be disposed in the binding region B0, and a same flexible circuit board 103 may be configured to bind these connection soldering pads or voltage terminals, which may be beneficial for reducing the number of flexible circuit boards 103 included in the display panel 100 and simplify the structure of the display panel 100.

Referring to FIG. 1, in an exemplary embodiment of the present disclosure, the first heating bus 51 may extend from the first side A1 to the second side A2; on the second side A2, the first heating bus 51 may be on the side of the gate drive element away from the display region AA; and the second heating bus 52 may be on the first side A1.

FIG. 1 illustrates relative positional relationship between the first heating bus 51 and the gate drive element 30 when a part of line segments in the first heating bus 51 and the gate drive element 30 are on a same side of the display panel 100. For example, when the first heating bus 51 led from the first voltage terminal 21 extends from the first side A1 to the second side A2 of the display panel 100, a part of the first heating bus 51 may be disposed on a same side frame of the display panel 100 as the gate drive element 30. When the first heating bus 51 and the gate drive element 30 are disposed on a same side frame of the display panel 100, if the first heating bus 51 and the gate drive element 30 are overlapped with each other along the direction perpendicular to the substrate 00, a capacitance may be formed between the first heating bus 51 and the gate drive element 30. Since the first heating bus 51 is generally configured to be relatively wide, more charges may be accumulated to cause static electricity problems and affect the normal displaying and heating operation. Therefore, when a part of the line segment of the first heating bus 51 and the gate drive element 30 are on a same side frame of the display panel 100, the first heating bus 51 may be disposed on the periphery of the gate drive element 30, that is, disposed on the side of the gate drive element away from the display region AA; and the first heating bus 51 and the gate drive element 30 may not be overlapped with each other along the direction perpendicular to the substrate 00, which may avoid charge accumulation caused by the capacitance formation between the first heating bus 51 and the gate drive element 30, thereby being beneficial for ensuring normal heating and display operation of the display panel 100.

Figure 10:
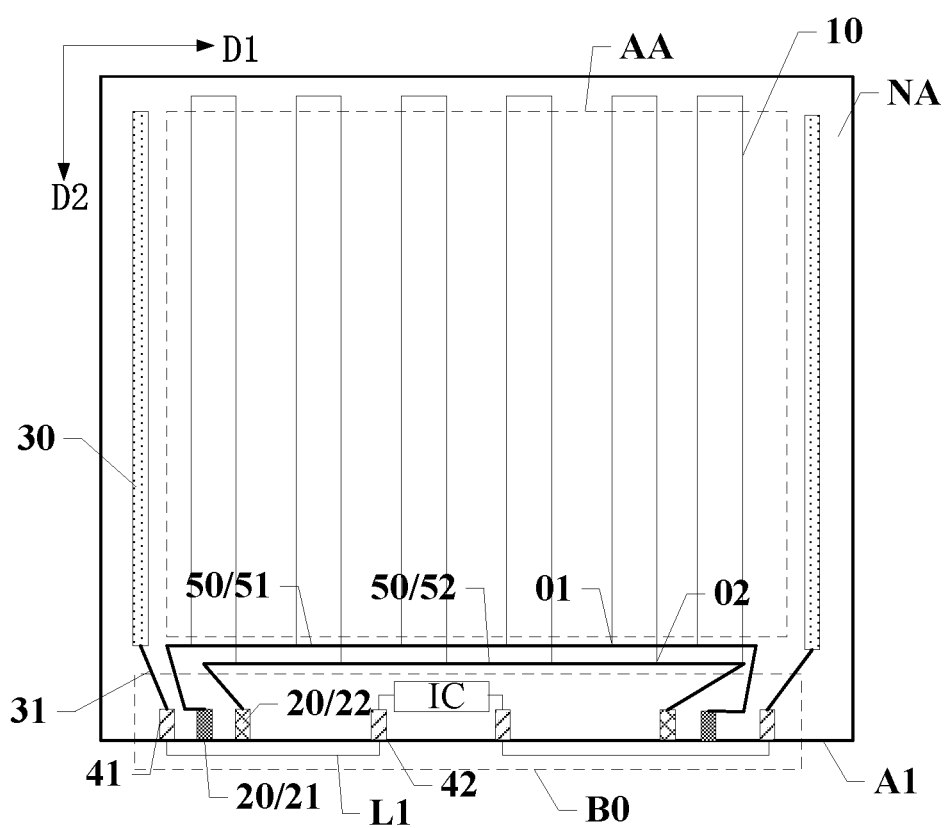
FIG. 10 illustrates another top view of a display panel according to various embodiments of the present disclosure.

FIG. 10 illustrates another top view of the display panel 100 according to various embodiments of the present disclosure. In an exemplary embodiment of the present disclosure, the heating drive element 20 may include the first voltage terminal 21 and the second voltage terminal 22; the heating bus 50 may include the first heating bus 51 connected to the first voltage terminal 21 and the second heating bus 52 connected to the second voltage terminal 22; the display panel 100 may further include the binding region B0 on the first side A1; the binding region B0 may include the first connection soldering pad 41 electrically connected to the gate drive element 30 and the second connection soldering pad 42 electrically connected to the control chip IC; and in the binding region B0, along the first direction D1, the first connection soldering pad 41 may be on the side of the first voltage terminal 21 and the second voltage terminal 22 adjacent to the second side A2, and the first heating bus 51 and the second heating bus 52 may be on the side of the first lead 31 facing toward the display region AA.

In one embodiment, it describes another arrangement manner of the first connection soldering pad 41, the second connection soldering pad 42, the first voltage terminal 21 and the second voltage terminal 22 when the first connection soldering pad 41, the second connection soldering pad 42, the first voltage terminal 21 and the second voltage terminal 22 are disposed in the binding region B0. For example, considering that the gate drive element 30 is in the non-display region NA of the second side A2 of the display panel 100, when the first connection soldering pad 41 is disposed on the side of the first voltage terminal 21 and the second voltage terminal 22 adjacent to the second side A2, it is beneficial for reducing the distance between the gate drive element 30 and the first connection soldering pad 41 and is convenient to use the first lead 31 to electrically connect the gate drive element 30 with the first connection soldering pad 41. At this point, the first heating bus 51 connected to the first voltage terminal 21 and the second heating bus 52 connected to the second voltage terminal 22 may be on the side of the first lead 31 facing toward the display region AA, thereby avoiding that the orthographic projection of the first lead 31 on the substrate 00 is overlapped with the orthographic projection of the first heating bus 51 or the second heating bus 52 on the substrate 00. Therefore, it is beneficial for avoiding the influence of the heating drive signal of the first heating bus 51 or the second heating bus 52 on the signal of the first lead 31 and is also beneficial for improving the low temperature display stability of the display panel 100.

Referring to FIG. 10, in an exemplary embodiment of the present disclosure, both the first heating bus 51 and the second heating bus 52 may be on the first side A1; the heating wiring 10 may include the first signal terminal and the second signal terminal; the first signal terminal may be electrically connected to the first heating bus 51, and the second signal terminal may be electrically connected to the second heating bus 52; and both the first signal terminal and the second signal terminal may be on the first side A1.

For example, when the first connection soldering pad 41 is disposed on the side of the first voltage terminal 21 and the second voltage terminal 22 adjacent to the second side A2 of the display panel 100, since the gate drive element 30 is electrically connected to the gate electrode line in the display region AA, the first heating bus 51 may be overlapped with the wiring between the gate drive element and the gate electrode line if a part of the first heating bus 51 is still connected from the second side A2, which may affect the accuracy of the signal transmitted by the gate drive element 30 to the gate electrode line. Therefore, in one embodiment, the first heating bus 51 led from the first voltage terminal 21 and the second heating bus 52 led from the second voltage terminal 22 may be both disposed in the non-display region NA of the first side A1 of the display panel 100, which may avoid that the first heating bus 51 is overlapped with the connection lead between the gate drive element 30 and the gate electrode line, thereby being beneficial for ensuring display reliability. When both the first heating bus 51 and the second heating bus 52 are disposed on the first side A1, in embodiments of the present disclosure, the first signal terminal 01 electrically connected to the first heating bus 51 and the second signal terminal 02 electrically connected to the second heating bus 52 in the heating wiring 10 may also be disposed on the first side A1, which is equivalent to extending the heating wiring 10 from the first side A1 to the opposite side of the first side A1 and then returning to the first side A1. In such way, the heating drive signal may also be applied to the heating wiring 10, and the heating function of the display region AA of the display panel 100 may also be realized.

Figure 11:
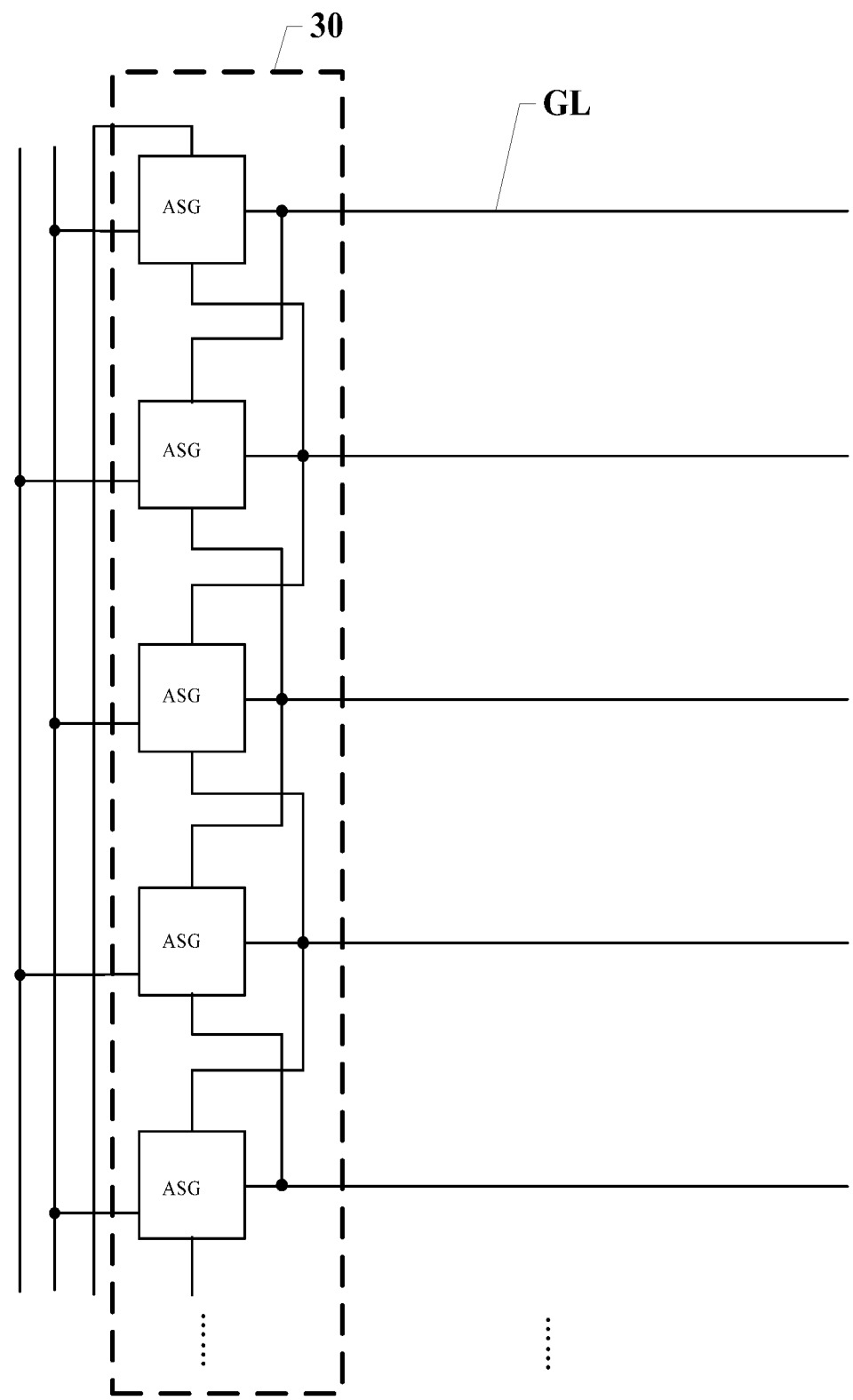
FIG. 11 illustrates a connection schematic of gate drive elements and gate electrode lines according to various embodiments of the present disclosure.

FIG. 11 illustrates a connection schematic of gate drive elements 30 and gate electrode lines GL according to various embodiments of the present disclosure. Referring to FIG. 11, in an exemplary embodiment of the present disclosure, the gate drive element 30 may include a gate drive circuit; the gate drive circuit may include cascaded shift registers ASG (amorphous silicon gate driver); and the shift registers ASG may be respectively connected to different gate electrode lines GL.

For example, in one embodiment, it describes a solution that the gate drive element 30 may include a plurality of cascaded shift registers ASG. Optionally, different shift registers ASG in a same gate drive element 30 may be respectively connected to different gate electrode lines GL. In an actual display process, the shift registers ASG in the gate drive element 30 may be controlled to scan the gate electrode lines GL in the display region AA from top to bottom, and the shift registers ASG in the gate drive element 30 may also be controlled to scan the gate electrode lines GL in the display region AA from bottom to top, thereby realizing the line-by-line display function. It should be noted that the embodiment shown in FIG. 11 only illustrates a solution that a same shift register ASG may be connected to one gate electrode line GL. In some other embodiments of the present disclosure, a same shift register ASG may be connected to two gate electrode lines GL, and the two gate electrode lines GL may be driven simultaneously, which may not be limited in the present disclosure.

When the gate drive element 30 includes cascaded shift registers ASG, each gate electrode line GL may be driven by only one shift register ASG, that is, one-side driving. When unilateral driving is used, the gate drive element 30 may be disposed on the left-side frame or the right-side frame of the display panel, or the gate drive elements 30 may be disposed on both the left-side frame and the right-side frame of the display panel. At this point, the shift registers ASG in the gate drive element 30 on the left-side frame may drive a part of the gate electrode lines GL; and the shift registers ASG in the gate drive element 30 on the right-side frame may drive another part of the gate electrode lines GL. In some other embodiments of the present disclosure, each gate electrode line GL may also be driven by two shift registers ASG simultaneously, thereby realizing double-side driving. At this point, the gate drive elements 30 may be respectively disposed on the left-side and right-side borders of the display panel, and a same gate electrode line GL may be electrically connected to the shift register ASG in the left-side frame and the shift register ASG in the right-side frame respectively, thereby improving the driving capability of the gate drive element 30.

Figure 12:
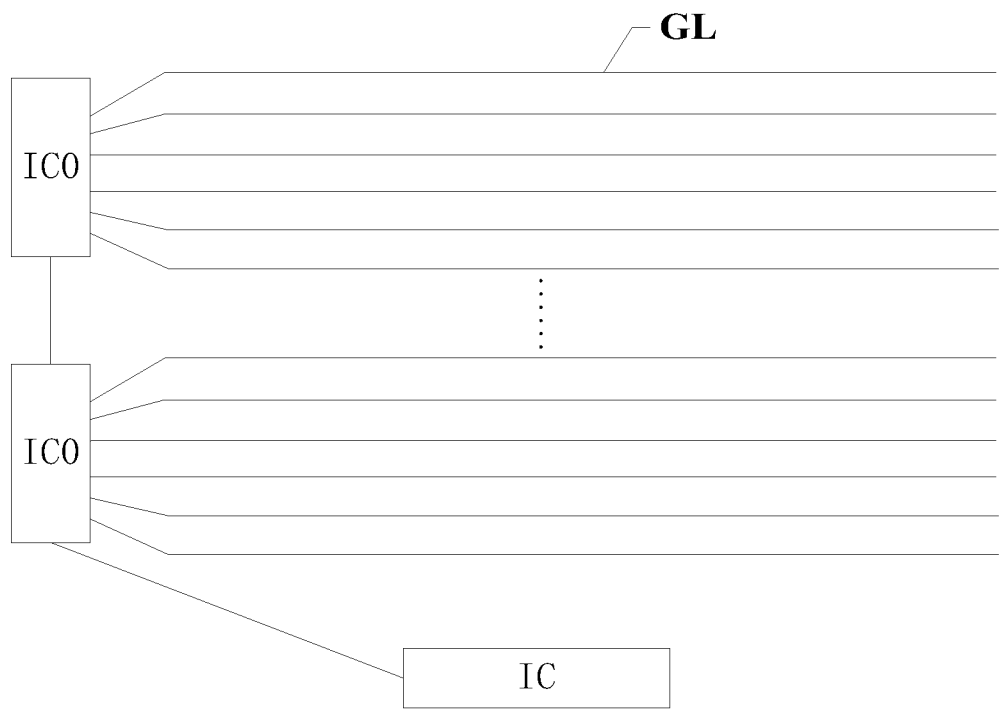
FIG. 12 illustrates another connection schematic of gate drive elements and gate electrode lines according to various embodiments of the present disclosure.

FIG. 12 illustrates another connection schematic of gate drive elements 30 and gate electrode lines GL according to various embodiments of the present disclosure. In an exemplary embodiment of the present disclosure, the gate drive element 30 may include at least one gate drive chip IC0, and a same gate drive chip IC0 may be electrically connected to a plurality of gate electrode lines GL; the control chip IC may include a timing control module; and the gate drive chip IC0 may be electrically connected to the timing control module in the control chip IC.

In one embodiment, it describes another implementation manner of the gate drive element 30. The gate drive element 30 in one embodiment may be embodied as the gate drive chip IC0. Optionally, a same gate drive chip IC0 may be electrically connected to a plurality of gate electrode lines GL; and the gate drive chip IC0 may respectively drive the gate electrode lines GL. In one embodiment, it describes a solution that a part of the gate electrode lines GL in the display panel 100 may be connected to one gate drive chip IC0, and another part of the gate electrode lines GL may be connected to another gate drive chip IC0. In some other embodiments of the present disclosure, a same gate drive chip IC0 may also be used to drive all gate electrode lines GL in the display region AA, which may not be limited in the present disclosure. When the gate drive element 30 is embodied as the gate drive chip, the gate drive chip IC0 may need to obtain timing signals through the timing control module. In embodiments of the present disclosure, the timing control module may be integrated in the control chip IC, so that high integration of the control chip IC may be realized. When the gate drive chip IC0 is electrically connected with the control chip IC, the gate drive chip IC0 may actually be electrically connected with the timing control module in the control chip IC through the first lead 31, thereby realizing signal transmission between the timing control module and the gate drive chip IC0.

In an exemplary embodiment of the present disclosure, referring to FIGS. 1 and 10, the heating wiring 10 may include the first signal terminal 01 and the second signal terminal 02; the heating bus 50 may include the first heating bus 51 and the second heating bus 52; the first heating bus 51 may be electrically connected to the first signal terminal 01 of the heating wiring 10; and the second heating bus 52 may be electrically connected to the second signal terminal 02 of the heating wiring 10.

Referring to FIGS. 1 and 10, each heating wiring 10 may include two signal terminals which are respectively the first signal terminal 01 electrically connected to the first heating bus 51 and the second signal terminal 02 electrically connected to the second heating bus 52; the first signal terminal 01 may obtain a heating drive signal through the first heating bus 51; and the second signal terminal 02 may obtain a heating drive signal through the second heating bus 52. Optionally, in embodiments of the present disclosure, the first voltage terminal 21 electrically connected to the first heating bus 51 may be a positive voltage terminal, and the second voltage terminal 22 electrically connected to the second heating bus 52 may be a negative voltage terminal; or the first voltage terminal 21 electrically connected to the first heating bus 51 may be a negative voltage terminal, and the second voltage terminal 22 electrically connected to the second heating bus 52 may be a positive voltage terminal, which may not be limited in the present disclosure. When a certain DC voltage is provided to the first heating bus 51 and the second heating bus 52 through the first voltage terminal 21 and the second voltage terminal 22, the DC voltage may be transmitted to corresponding the heating wiring 10 through the first voltage terminal 21 and the second voltage terminal 22, so that the heating wiring 10 may generate heat, which may realize heating the liquid crystal in the display panel 100 and satisfying the low-temperature display requirement of the display panel 100.

Figure 13:
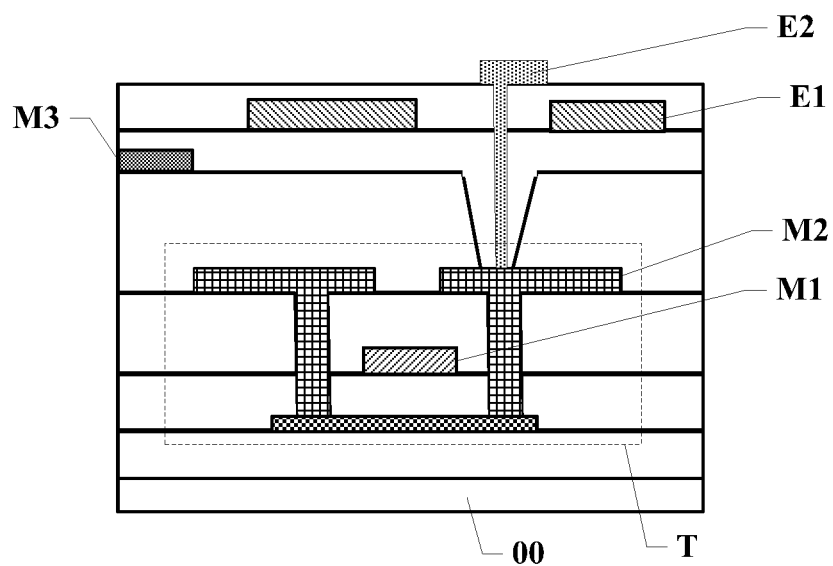
FIG. 13 illustrates a film layer structural schematic of a display region in a display panel according to various embodiments of the present disclosure.

FIG. 13 illustrates a film layer structural schematic of a display region in a display panel according to various embodiments of the present disclosure. In order to realize the display function, for example, referring to FIG. 13, a plurality of transistors T may be introduced in the display panel 100. The transistor T may include a gate electrode, an active layer, and a source and drain electrode. The metal layer where the gate is located is the first metal layer M1; and the metal layer where the source and drain electrode is located is the second metal layer M2. The first metal layer M1 may be on the side of the second metal layer M2 facing toward the substrate 00. Optionally, the display region of the display panel may further include a common electrode E1 and a pixel electrode E2, where the pixel electrode E2 may be electrically connected to the source or drain electrode of the transistor T.

Figure 14:
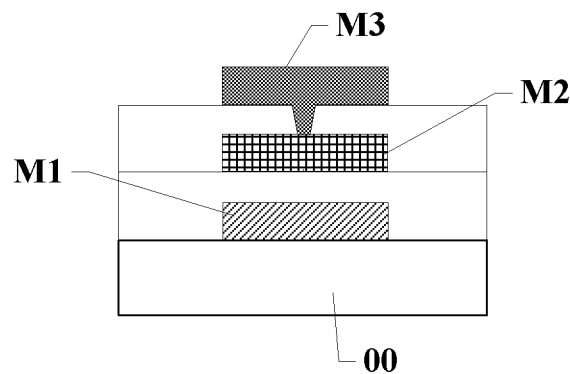
FIG. 14 illustrates a film layer structural schematic of a heating bus in a display panel according to various embodiments of the present disclosure.
Figure 15:
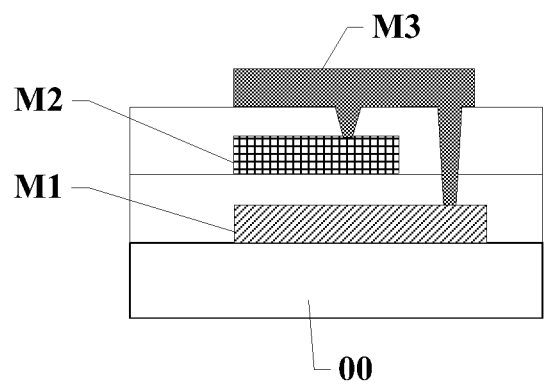
FIG. 15 illustrates another film layer structural schematic of a heating bus in a display panel according to various embodiments of the present disclosure.
Figure 16:
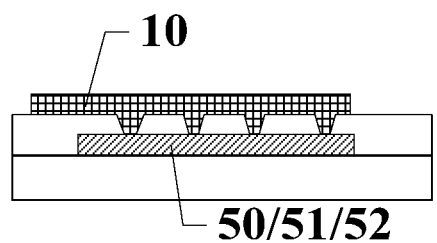
FIG. 16 illustrates a connection schematic of a heating bus and a heating wiring in a display panel according to various embodiments of the present disclosure.

FIG. 14 illustrates a film layer structural schematic of a heating bus in the display panel 100 according to various embodiments of the present disclosure; FIG. 15 illustrates another film layer structural schematic of a heating bus in the display panel 100 according to various embodiments of the present disclosure; and FIG. 16 illustrates a connection schematic of the heating bus 50 and the heating wiring 10 in the display panel 100 according to various embodiments of the present disclosure. FIG. 14 illustrates a solution that when the heating bus 50 is disposed on both the second metal layer M2 and the third metal layer M3, the part of the heating bus 50 in the second metal layer M2 may be electrically connected to the part of the heating bus 50 in the third metal layer M3 through a connection hole. FIG. 15 illustrates a solution that when the heating bus 50 is disposed on all of the first metal layer M1, the second metal layer M2 and the third metal layer M3, the parts of the heating bus 50 on three metal layers may be electrically connected with each other. Other possible film layer structures for the heating bus 50 may not be shown in the present disclosure.

Referring to FIGS. 1-10 and 14-16, in an exemplary embodiment of the present disclosure, the display panel 100 may further include the first metal layer M1, the second metal layer M2 and the third metal layer M3; along the direction perpendicular to the substrate 00, two adjacent metal layers may be separated by an insulating layer; the heating bus 50 may be in at least one of the first metal layer M1, the second metal layer M2 and the third metal layer M3; the heating wiring 10 and at least a part of the heating bus 50 may be disposed in different layers; and the heating wiring 10 may be electrically connected to the heating bus 50 through a connection hole or a connecting bridge.

When the heating bus 50, such as the first heating bus 51 and the second heating bus 52, is introduced on the display panel 100, both the first heating bus 51 and the second heating bus 52 may be disposed at the first metal layer M1; or both the first heating bus 51 and the second heating bus 52 may be disposed at the second metal layer M2; or both the first heating bus 51 and the second heating bus 52 may be disposed at the third metal layer M3; or one of the first heating bus 51 and the second heating bus 52 may be disposed on the first metal layer M1, and another one of the first heating bus 51 and the second heating bus 52 may be disposed on the second metal layer M2 or the third metal layer M3, and so on. Obviously, in some other embodiments of the present disclosure, the first heating bus 51 or the second heating bus 52 may also be disposed on at least two of the first metal layer M1, the second metal layer M2 or the third metal layer M3; and line segments in different metal layers in a same first heating bus 51 or a same second heating bus 52 may be electrically connected through connection holes. When the first heating bus 51 or the second heating bus 52 is disposed on at least two metal layers, the parts in different metal layers may be regarded as a parallel structure. In such way, it is beneficial for reducing overall impedance of the heating bus 50 and reducing the power consumption on the heating bus 50, so that more effective power may be obtained on the heating bus 50, thereby being beneficial for improving the heating efficiency of the display panel 100.

Optionally, referring to FIG. 16, in embodiments of the present disclosure, the heating wiring 10 and at least a part of the heating bus 50 may be disposed in different layers, for example, the heating wiring 10 and the first heating bus 51 may be disposed in different layers. At this point, the heating wiring 10 may be electrically connected to the first heating bus 51 through a connection hole or a connection bridge, thereby realizing reliable electrical connection between the heating wiring 10 and the first heating bus 51.

Referring to FIGS. 1-10 and 16, in an exemplary embodiment of the present disclosure, a same heating wiring 10 may be electrically connected to the heating bus 50 through a plurality of connection holes.

In order to realize the heating of the heating wiring 10, the current transmitted on the heating bus 50 may be relatively large. If only one connection hole is used to connect the heating bus 50 with a single heating wiring 10, the current of the single connection hole may be excessively large. As a result, the connection hole may have a relatively great risk of burns, which may affect the signal transmission of the heating bus 50 to corresponding heating wiring 10. Therefore, in embodiments of the present disclosure, the plurality of connection holes may be introduced, so that a same heating wiring 10 may be electrically connected to the heating bus 50 through the plurality of connection holes, thereby avoiding the problem of excessive current in a single connection hole, and being beneficial for ensuring the reliability of signal transmission from the heating bus 50 to the heating wiring 10 and for improving the heating reliability of the liquid crystal in the display region in a low temperature environment.

Figure 17:
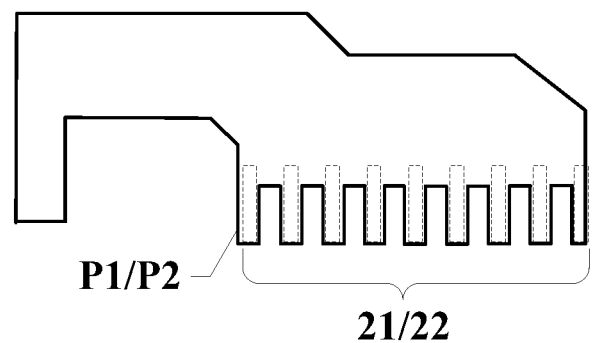
FIG. 17 illustrates a connection schematic of a heating bus and a heating wiring.

FIG. 17 illustrates a connection schematic of the heating bus 50 and the heating wiring 10. Referring to FIGS. 4, 5, 9 and 17, in an exemplary embodiment of the present disclosure, the display panel 100 may include the binding region B0 on the first side A1; the heating drive element 20 may include the plurality of heating pads in the binding region B0; and a same heating bus 50 may be electrically connected to the plurality of heating pads. Optionally, the first voltage terminal 21 in the heating drive element 20 may include a plurality of first heating pads P1; the second voltage terminal 22 may include a plurality of second heating pads P2; a same first heating bus 51 may be electrically connected to the plurality of first heating pads P1; and a same second heating bus 52 may be electrically connected to the plurality of second heating pads P2.

In embodiments of the present disclosure, the transmission of the heating drive signal may be realized by electrically connecting the flexible circuit board 103 with the first voltage terminal 21 and the second voltage terminal 22. The dotted rectangle in FIG. 17 shows the position on the flexible circuit board corresponding to the heating pad electrically connected to the first heating pad P1 or the second heating pad P2. Considering that the current carrying capacity of the flexible circuit board 103 is limited, if only one first heating pad P1 or only one second heating pad P2 is disposed on the first voltage terminal 21 or the second voltage terminal 22, it may cause excessive current on the soldering pad. In embodiments of the present disclosure, the plurality of first heating pads P1 may be disposed on the first voltage terminal 21, and the plurality of second heating pads P2 may be disposed on the second voltage terminal 22. When the flexible circuit board 103 is electrically connected to both the first voltage terminal 21 and the second voltage terminal 22, it is beneficial for dividing the current on the flexible circuit board 103, which may be compatible to the current carrying capacity of the flexible circuit board 103 and protect the normal operation of the heating circuit.

Optionally, when the first heating bus 51 is electrically connected to the plurality of first heating pads P1, the signals transmitted on all first heating pads P1 may be same; and when the second heating bus 52 is electrically connected to the plurality of second heating pads P2, the signals transmitted on all second heating pads P2 may also be same.

It should be noted that the present disclosure may not limit the number of the first heating pads P1 connected to the first heating bus 51 and may not limit the number of the second heating pads P2 corresponding to the second heating bus 52. FIG. 4 and FIG. 17 only illustrate a solution of disposing all first heating pads P1 in a same row. In some other embodiments of the present disclosure, when the number of the first heating pads P1 is relatively large, the first heating pads P1 may also be arranged in different rows; and the first heating pads P1 in different rows may all be electrically connected to the first heating bus 51. The arrangement of the second heating pads P2 refers to the arrangement of the first heating pads P1 in embodiments of the present disclosure, which may not be limited in the present disclosure. Obviously, only the heating pads of the rectangular structure may be used to illustrate the shapes of the first heating pad P1 and the second heating pad P2 in FIG. 4 and FIG. 17, which may not limit actual shapes of the heating pads. In some other embodiments of the present disclosure, the shapes of the heating pads may also be embodied as other shapes.

Figure 18:
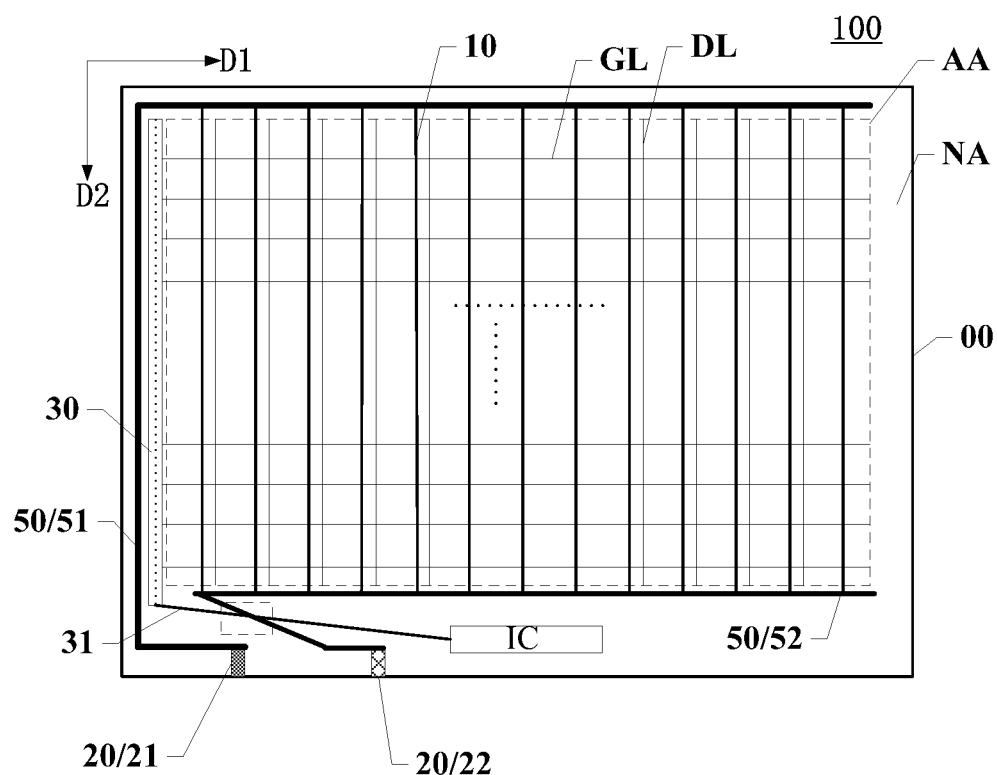
FIG. 18 illustrates another top view of a display panel according to various embodiments of the present disclosure.
Figure 19:
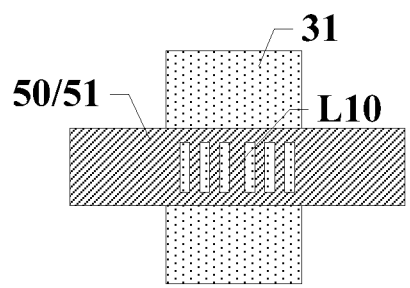
FIG. 19 illustrates a top view of a heating bus and a first lead in an overlapped region.

FIG. 18 illustrates a top view of the display panel 100 according to various embodiments of the present disclosure; and FIG. 19 illustrates a top view of the heating bus 50 and the first lead 31 in an overlapped region. Referring to FIGS. 18-9, based on the same inventive concept, the present disclosure further provides another display panel 100.

The display panel 100 may include the substrate 00 and the plurality of gate electrode lines GL, the plurality of data lines DL and the plurality of heating wirings 10 at least in the display region AA of the display panel 100. The gate electrode lines GL may extend along the first direction D1 and be arranged along the second direction D2; the data lines DL may extend along the second direction D2 and be arranged along the first direction D1; and the first direction D1 may intersect the second direction D2. The display panel 100 may further include the non-display region NA at least partially surrounding the display region AA.

The display panel 100 may further include the control chip IC in the non-display region NA of the first side A1 of the display panel 100. The control chip IC may be at least electrically connected to the data line DL. Along the second direction D2, the first side A1 may be adjacent to the display region AA.

The display panel 100 may further include the heating drive element 20 which is in the non-display region NA of the first side A1 and electrically connected to the heating wiring 10 through the heating bus 50.

The display panel 100 may further include the gate drive element 30 in the non-display region NA of the second side A2 of the display panel 100. The second side A2 may be adjacent to the first side A1. The gate drive element 30 may be electrically connected to the gate electrode line GL and electrically connected to the control chip IC through the first lead 31.

Along the third direction, the first lead 31 and the heating bus 50 may be at least partially overlapped with each other to form an overlapped region. In the overlapped region, one of the first lead 31 and the heating bus 50 may be hollowed out. The third direction may be perpendicular to the plane of the substrate 00.

The difference between the display panel 100 provided by one embodiment and the display panel 100 provided by above-mentioned embodiments is that the first lead 31 and the heating bus 50 may not be overlapped with each other along the third direction in above-mentioned embodiments; and the first lead 31 and the heating bus 50 may be partially overlapped with each other along the third direction in one embodiment. After the heating drive element 20 and the heating bus 50 are introduced into the display panel 100, when the control chip IC is also on the substrate 00, the first lead 31 led from the gate drive element 30 may be directly connected to the control chip IC by pulling wires, without the need of wiring, which may be beneficial for simplifying the wiring complexity of the display panel 100. When the first lead 31 and the heating bus 50 are overlapped with each other, in the overlapped region, one of the first lead 31 and the heating bus 50 may be hollowed out, which may reduce actual overlapped area in the overlapped region of the first lead 31 and the heating bus 50. When such overlapped area is reduced, the parasitic capacitance between the first lead 31 and the heating bus 50 may also be reduced, which may effectively reduce the short-circuit problem caused by static electricity between the first lead 31 and the heating bus 50. When the signal on the heating bus 50 changes, the influence of the signal of the heating bus 50 on the signal of the first lead 31 may be reduced, which may be beneficial for reducing the influence on the signal on the gate drive element 30 and ensuring the display reliability of the display panel 100 in a low temperature environment to a certain extent.

Referring to FIG. 19, in an exemplary embodiment of the present disclosure, in the overlapped region, one of the first lead 31 and the heating bus 50 may include a plurality of sub-wirings L10 connected in parallel, or one of the first lead 31 and the heating bus 50 may be a grid shape or a comb shape.

For example, when the orthographic projections of the heating bus 50 and the first lead 31 on the substrate 00 are overlapped each other, in order to reduce the overlapped area between the heating bus 50 and the first lead 31, FIG. 19 illustrates a solution that the heating bus 50 of the overlapped region may be configured to include a plurality of sub-wirings L10. In addition, the heating bus 50 may also be configured to be a grid shape, or the heating wirings 10 in the overlapped region may be configured to be a comb shape. All of these manners may reduce the overlapped area between the heating bus 50 and the first lead 31, and effectively reduce the influence of the signal of the heating bus 50 on the signal of the first lead 31.

It should be noted that FIG. 19 only illustrates the solution that the heating bus 50 in the overlapped region may be configured to have hollows. In some other embodiments of the present disclosure, the first lead 31 in the overlapped region may also be configured to have hollows, which may also be beneficial for reducing the overlapped area between the heating bus 50 and the first lead 31 and reduce the interference of the heating bus 50 on the signal of the first lead 31.

Figure 20:
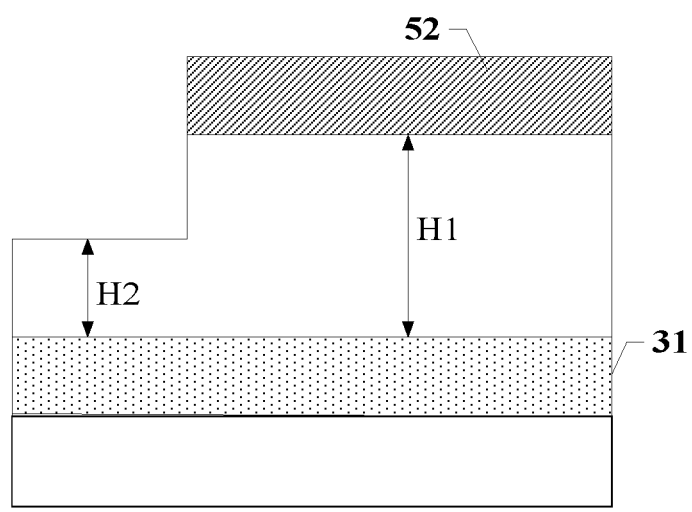
FIG. 20 illustrates a film layer schematic of a heating bus and a first lead in an overlapped region in FIG. 19.

Referring to FIGS. 18-20, FIG. 20 illustrates a film layer schematic diagram of the heating bus 50 and the first lead 31 in the overlapped region in FIG. 18. Based on the same inventive concept, the present disclosure further provides another display panel 100. The structure of such display panel 100 may refer to FIG. 18.

The display panel 100 may include the substrate 00 and the plurality of gate electrode lines GL, the plurality of data lines DL and the plurality of heating wirings 10 at least in the display region AA of the display panel 100. The gate electrode lines GL may extend along the first direction D1 and be arranged along the second direction D2; the data lines DL may extend along the second direction D2 and be arranged along the first direction D1; and the first direction D1 may intersect the second direction D2. The display panel 100 may further include the non-display region NA at least partially surrounding the display region AA.

The display panel 100 may further include the control chip IC in the non-display region NA of the first side A1 of the display panel 100. The control chip IC may be at least electrically connected to the data line DL. Along the second direction D2, the first side A1 may be adjacent to the display region AA.

The display panel 100 may further include the heating drive element 20 which may be in the non-display region NA of the first side A1 and electrically connected to the heating wiring 10 through the heating bus 50.

The display panel 100 may further include the gate drive element 30 in the non-display region NA of the second side A2 of the display panel 100. The second side A2 may be adjacent to the first side A1; and the gate drive element 30 may be electrically connected to the gate electrode line GL and electrically connected to the control chip IC through the first lead 31.

Along the third direction, the first lead 31 and the heating bus 50 may be at least partially overlapped with each other to form an overlapped region. In the overlapped region, the thickness of the insulating layer between the first lead 31 and the heating bus 50 is H1, and in the non-overlapped region, the thickness of the insulating layer between the first lead 31 and the heating bus 50 is H2, where H1>H2.

For example, when the orthographic projections of the first lead 31 and the heating bus 50 on the substrate 00 are at least partially overlapped with each other, in one embodiment, the thickness of the insulating layer between the first lead 31 and the heating bus 50 in the overlapped region may be configured to be relatively large, such that such thickness may be greater than the thickness of the insulating layer between the first lead 31 and the heating bus 50 in the non-overlapped region. According to calculation formula of capacitance $C=\varepsilon S/d$, when the overlapped region is same, the larger the distance between the first lead 31 and the heating bus 50 is, the smaller the coupling capacitance between the first lead 31 and the heating bus 50 is. When the signal on the heating bus 50 changes, the influence of the signal change of the heating bus 50 on the signal of the first lead 31 may be reduced, which may be beneficial for reducing the influence on the signal on the gate drive element 30 and ensuring the display reliability of the display panel 100 in a low temperature environment to a certain extent.

Figure 21:
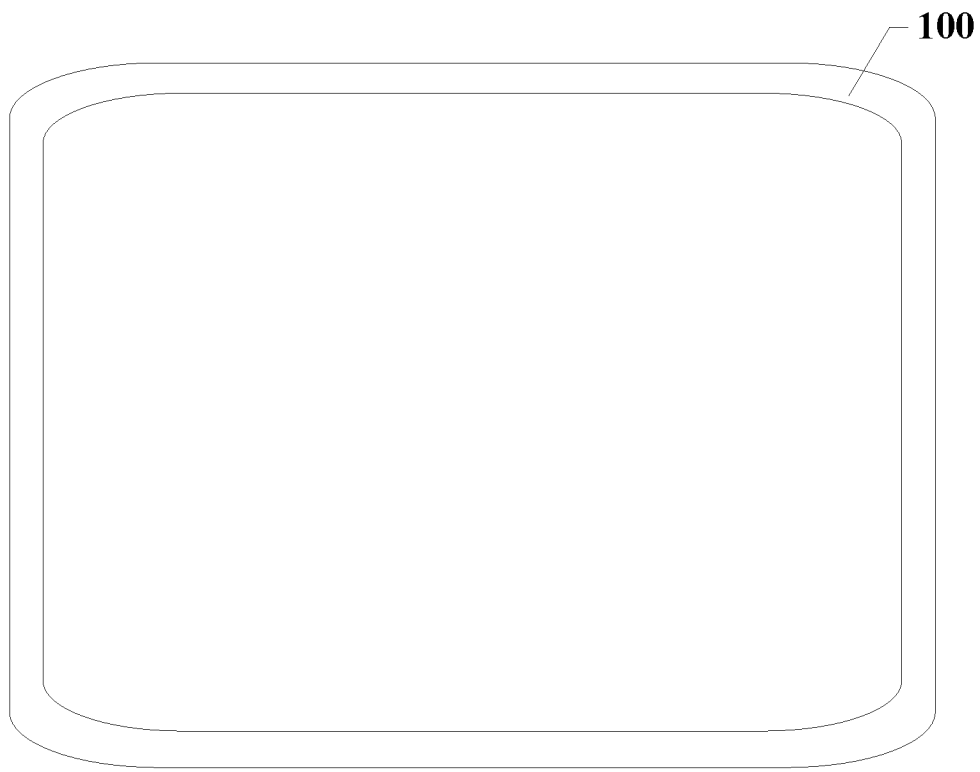
FIG. 21 illustrates a top view of a display apparatus according to various embodiments of the present disclosure.
Figure 22:
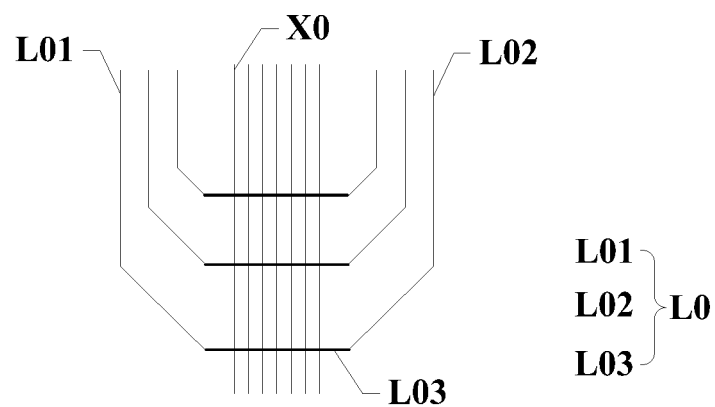
FIG. 22 illustrates a top view of signal lines and heating lines on a flexible circuit board.

FIG. 21 illustrates a top view of a display apparatus 200 according to various embodiments of the present disclosure; and FIG. 22 illustrates a top view of signal lines and heating lines on a flexible circuit board 103. Based on a same inventive concept, referring to FIGS. 3, 4, 21 and 22, the display apparatus 200 of the present disclosure may include the display panel 100 provided by any of above-mentioned embodiments of the present disclosure. The display panel 100 may include a flexible circuit board 103; the flexible circuit board 103 may include a heating line X0 electrically connected to the heating drive element 20 and a signal line L00 electrically connected to the gate drive element 30; along the direction perpendicular to the flexible circuit board 103, the heating line X0 may be at least overlapped with the signal line L00; and at the overlapped position, the heating line X0 and the signal line L00 may be separated by at least two insulating layers.

For example, the heating line X0 on the flexible circuit board 103 may be electrically connected to the heating bus 50 on the display panel 100; and the signal line L00 may be electrically connected to the gate drive element. When the heating line X0 and the signal line L00 on the flexible circuit board 103 are overlapped along the direction perpendicular to the flexible circuit board 103, the present disclosure defines that the heating line X0 and the signal line L00 may be separated by at least two insulating layers, which may be beneficial for increasing the distance between the heating line X0 and the signal line L00 in the overlapped region. According to the capacitance formula $C=\varepsilon S/d$, when the distance increases, it is beneficial for reducing the coupling capacitance between the heating line X0 and the signal line L00, so it may be beneficial for reducing the influence of the heating line X0 of the flexible circuit board 103 on the signal line L00. Furthermore, it may be beneficial for improving the accuracy of the signal provided from the flexible circuit board 103 to the gate drive element 30, thereby being beneficial for improving the low-temperature display reliability of the display apparatus 200. Optionally, the insulating layer between the heating line X0 and the signal line L00 on the flexible circuit board 103 may be polyesterimide which has a relatively small dielectric constant. A relatively small dielectric constant may also be beneficial for reducing the coupling capacitance between the heating line X0 and the signal line L00.

It should be noted that, embodiments of the display apparatus 200 provided by the present disclosure may refer to embodiments of the display panel 100 described above, which may not be described in detail herein. The display apparatus 200 provided by embodiments of the present disclosure may be embodied as any product or component with a display function, such as a mobile phone, a tablet computer, a television, a monitor, a notebook computer, a digital photo frame, a navigator, and/or the like. The display apparatus may be especially suitable for display equipment used in a low temperature environment.

Figure 23:
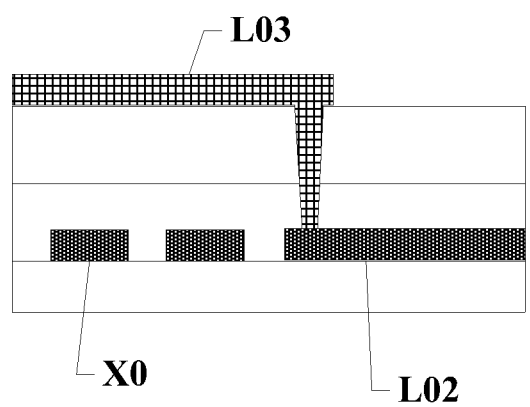
FIG. 23 illustrates a film layer schematic of signal lines and heating lines on a flexible circuit board.

FIG. 23 illustrates a film layer schematic of signal lines X0 and heating lines L00 on the flexible circuit board 103. Referring to FIGS. 22-23, in an exemplary embodiment of the present disclosure, the signal line L00 may include a first signal line L01 and a second signal line L02 which are disposed in a same layer as the heating line X0 and include a third signal line L03 disposed in a different layer from the heating line X0. Along the direction perpendicular to the flexible circuit board 103, the third signal line L03 may be overlapped with the heating line X0. A same third signal line L03 may be electrically connected to the first signal line L01 and the second signal line L02 through different connection holes, respectively.

For example, on the flexible circuit board 103, when the signal line L00 connected to the gate drive element 30 is overlapped with the heating line X0 connected to the heating drive element 20, if the first signal line L01, the second signal line L02 and the heating line X0 are disposed in a same layer, and if the third signal line L03 and the heating line X0 are disposed in different layers, the third signal line L03 may function as a bridge, and the first signal line L01 and the second signal line L02 may be electrically connected with each other through connection hole. Since the third signal line L03 and the heating line X0 are separated by at least two insulating layers, even if the third signal line L03 is overlapped with the heating line X0, generated coupling capacitance therebetween may be extremely small, and the signal on the heating line X0 may hardly interfere with the signal on the third signal line L03, which may be beneficial for improving the low temperature display stability of the display apparatus 200.

From above-mentioned embodiments, it may be seen that the display panel and the display apparatus provided by the present disclosure may achieve at least following beneficial effects.

In the display panel and the display apparatus provided by the present disclosure, the heating wiring may be introduced on the display panel; in the low temperature display stage, the heating wiring may be configured to heat the display panel, which may meet normal use requirement of display products in a low temperature environment; and the product structure may be greatly simplified compared to the solution of additionally introducing a heater in the existing technology. In particular, when the heating bus is introduced into the display panel, the wiring manner of the heating bus and the first lead connected to the gate drive element may be improved, and the heating bus may not be overlapped with the first lead along the direction perpendicular to the substrate, thereby avoiding the influence of the signal of the heating bus on the signal of the first lead. Or, when the heating bus is overlapped with the first lead, in the overlapped region, at least one of the heating wiring and the first lead may be hollowed out, thereby reducing actual overlapped area between the heating bus and the first lead and avoiding excessive overlapped area to generate parasitic capacitance which may affect the signal on the first lead when the signal on the heating bus is turned on or off. Or, when the heating bus is overlapped with the first lead, the thickness of the insulating layer between the heating bus and the first lead in the overlapped region may be increased, thereby reducing the parasitic capacitance of the overlapped region, which may also avoid or reduce the influence of the signal of the heating bus on the signal of the first lead. Therefore, while the display panel can be reliably heated in a low temperature environment, it is also beneficial for avoiding the problem of abnormal display caused by the heating signal affecting the signal on the first lead, thereby being beneficial for improving the display reliability of the display product in a low temperature environment.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A display panel, comprising:
   a substrate, and a plurality of gate electrode lines, a plurality of data lines and a plurality of heating wirings which are at least in a display region of the display panel, wherein the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region;
   a control chip, in the non-display region on a first side of the display panel, wherein the control chip is at least electrically connected to a data line of the plurality of data lines; and along the second direction, the first side is adjacent to the display region and below the display region;
   a heating drive element, in the non-display region on the first side such that the control chip and the heating drive element are on the same side of the display panel, wherein the heating drive element is electrically connected to a heating wiring of the plurality of heating wirings through a heating bus; and
   a gate drive element, in the non-display region on a second side of the display panel, wherein the second side is adjacent to the first side; and the gate drive element is electrically connected to a gate electrode line of the plurality of gate electrode lines and electrically connected to the control chip through a first lead,
   wherein:
   the display panel further includes:
   a first metal layer, a second metal layer and a third metal layer which are disposed on the substrate, wherein along a direction perpendicular to the substrate, two adjacent metal layers are separated by an insulating layer; the heating bus is in at least one of the first metal layer, the second metal layer and the third metal layer; the heating wiring and at least a part of the heating bus are disposed in different layers; and the heating wiring is electrically connected to the heating bus through a connection hole or a connecting bridge.

2. The display panel according to claim 1, wherein:
   on the first side, a minimum distance between orthographic projections of the first lead and the heating bus on the substrate is D0, wherein D0≥10 μm.

3. The display panel according to claim 1, further including:
   a first connection lead, wherein the gate drive element is electrically connected to the first connection lead through the first lead; and the control chip is electrically connected to the first connection lead through a second lead.

4. A display panel, comprising:
a substrate, and a plurality of gate electrode lines, a plurality of data lines and a plurality of heating wirings which are at least in a display region of the display panel, wherein the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region;
a control chip, in the non-display region on a first side of the display panel, wherein the control chip is at least electrically connected to a data line of the plurality of data lines; and along the second direction, the first side is adjacent to the display region and below the display region;
a heating drive element, in the non-display region on the first side such that the control chip and the heating drive element are on the same side of the display panel, wherein the heating drive element is electrically connected to a heating wiring of the plurality of heating wirings through a heating bus; and
a gate drive element, in the non-display region on a second side of the display panel, wherein the second side is adjacent to the first side; and the gate drive element is electrically connected to a gate electrode line of the plurality of gate electrode lines and electrically connected to the control chip through a first lead,
a first connection lead, wherein the gate drive element is electrically connected to the first connection lead through the first lead; and the control chip is electrically connected to the first connection lead through a second lead,
wherein the display panel further includes:
a binding region on the first side and a flexible circuit board electrically connected to the binding region, wherein: the first connection lead is on the flexible circuit board; the binding region includes a first connection soldering pad and a second connection soldering pad; the gate drive element is electrically connected to the first connection soldering pad through the first lead; the control chip is electrically connected to the second connection soldering pad through the second lead; and two ends of the first connection lead on the flexible circuit board are electrically connected to the first connection soldering pad and the second connection soldering pad, respectively,
a binding region on the first side; both the control chip and the heating drive element are in the binding region; and the first connection lead is at the display panel and on a side of the binding region away from the display region, or
a binding region on the first side and a flexible circuit board electrically connected to the binding region, wherein the binding region includes a plurality of first conductive soldering pads; a first conductive soldering pad of the plurality of first conductive soldering pads is at least electrically connected to the data line; the first connection lead and the second lead are on the flexible circuit board; the control chip is on the flexible circuit board and at least electrically connected to the first conductive soldering pad; and the first lead is on the display panel; and the binding region includes a first connection soldering pad; the flexible circuit board includes a second connection soldering pad electrically connected to the first connection soldering pad; on the flexible circuit board, the second connection soldering pad is electrically connected to the first connection lead; and the gate drive element is electrically connected to the first connection soldering pad through the first lead.

5. The display panel according to claim 4, wherein:
the control chip and the heating drive element are both in the binding region; and along the first direction, heating drive elements are on two sides of the control chip.

6. The display panel according to claim 5, wherein:
a number of control chips is n, wherein n≥2; in the binding region, the control chips are arranged along the first direction; the binding region further includes third connection soldering pads wherein a number of third connection soldering pads corresponds to the number of control chips; the flexible circuit board further includes a second connection lead; the control chip is electrically connected to the third connection soldering pad through a third lead; and third connection soldering pads corresponding to two adjacent control chips are electrically connected with each other through the second connection lead on the flexible circuit board.

7. The display panel according to claim 3, wherein:
the display panel includes a binding region on the first side; both the control chip and the heating drive element are in the binding region; and the first connection lead is at the display panel and on a side of the binding region away from the display region.

8. The display panel according to claim 3, further including:
a binding region on the first side and a flexible circuit board electrically connected to the binding region, wherein the binding region includes a plurality of first conductive soldering pads; a first conductive soldering pad of the plurality of first conductive soldering pads is at least electrically connected to the data line; the first connection lead and the second lead are on the flexible circuit board; the control chip is on the flexible circuit board and at least electrically connected to the first conductive soldering pad; and the first lead is on the display panel; and
the binding region includes a first connection soldering pad; the flexible circuit board includes a second connection soldering pad electrically connected to the first connection soldering pad; on the flexible circuit board, the second connection soldering pad is electrically connected to the first connection lead; and the gate drive element is electrically connected to the first connection soldering pad through the first lead.

9. The display panel according to claim 8, further including:
a printed circuit board, wherein a number of flexible circuit boards is m, wherein m≥2; and control chips on different flexible circuit boards are electrically connected with each other through a third connection lead on the printed circuit board.

10. A display panel, comprising:
a substrate, and a plurality of gate electrode lines, a plurality of data lines and a plurality of heating wirings which are at least in a display region of the display panel, wherein the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region;

a control chip, in the non-display region on a first side of the display panel, wherein the control chip is at least electrically connected to a data line of the plurality of data lines; and along the second direction, the first side is adjacent to the display region and below the display region;

a heating drive element, in the non-display region on the first side such that the control chip and the heating drive element are on the same side of the display panel, wherein the heating drive element is electrically connected to a heating wiring of the plurality of heating wirings through a heating bus; and a gate drive element, in the non-display region on a second side of the display panel, wherein the second side is adjacent to the first side; and the gate drive element is electrically connected to a gate electrode line of the plurality of gate electrode lines and electrically connected to the control chip through a first lead, wherein: the heating drive element includes a first voltage terminal and a second voltage terminal; the heating bus includes a first heating bus connected to the first voltage terminal and a second heating bus connected to the second voltage terminal; the display panel further includes a binding region on the first side; and the binding region include a first connection soldering pad electrically connected to the gate drive element and a second connection soldering pad electrically connected to the control chip; and in the binding region, along the first direction, the first connection soldering pad is between the first voltage terminal and the second voltage terminal, and the first lead is between the first heating bus and the second heating bus, or the heating drive element includes a first voltage terminal and a second voltage terminal; the heating bus includes a first heating bus connected to the first voltage terminal and a second heating bus connected to the second voltage terminal; the display panel further includes a binding region on the first side; and the binding region include a first connection soldering pad electrically connected to the gate drive element and a second connection soldering pad electrically connected to the control chip; and in the binding region, along the first direction, the first connection soldering pad is on a side of the first voltage terminal and the second voltage terminal adjacent to the second side; and the first heating bus and the second heating bus are on a side of the first lead facing toward the display region.

11. The display panel according to claim 10, wherein:
the first heating bus extends from the first side to the second side; on the second side, the first heating bus is on a side of the gate drive element away from the display region; and the second heating bus is on the first side.

12. The display panel according to claim 1, wherein:
the heating drive element includes a first voltage terminal and a second voltage terminal; the heating bus includes a first heating bus connected to the first voltage terminal and a second heating bus connected to the second voltage terminal; the display panel further includes a binding region on the first side; and the binding region include a first connection soldering pad electrically connected to the gate drive element and a second connection soldering pad electrically connected to the control chip; and in the binding region, along the first direction, the first connection soldering pad is on a side of the first voltage terminal and the second voltage terminal adjacent to the second side; and the first heating bus and the second heating bus are on a side of the first lead facing toward the display region.

13. The display panel according to claim 12, wherein:
both the first heating bus and the second heating bus are on the first side; and
the heating wiring includes a first signal terminal and a second signal terminal; the first signal terminal is electrically connected to the first heating bus; the second signal terminal is electrically connected to the second heating bus; and both the first signal terminal and the second signal terminal are on the first side.

14. The display panel according to claim 1, wherein:
the gate drive element includes a gate drive circuit; the gate drive circuit includes cascaded shift registers; and the cascaded shift registers are respectively connected to different gate electrode lines.

15. The display panel according to claim 1, wherein:
the gate drive element includes at least one gate drive chip; a same gate drive chip is electrically connected to the plurality of gate electrode lines; the control chip includes a timing control module; and one gate drive chip is electrically connected to the timing control module in the control chip.

16. The display panel according to claim 1, wherein:
the heating wiring includes a first signal terminal and a second signal terminal; the heating bus includes a first heating bus and a second heating bus; the first heating bus is electrically connected to the first signal terminal of the heating wiring; and the second heating bus is electrically connected to the second signal terminal of the heating wiring.

17. The display panel according to claim 1, wherein:
a same heating wiring is electrically connected to the heating bus through a plurality of connection holes.

18. The display panel according to claim 1, wherein:
the display panel includes a binding region on the first side; the heating drive element includes a plurality of heating pads in the binding region; and a same heating bus is electrically connected to the plurality of heating pads.

19. A display panel, comprising:
a substrate, and a plurality of gate electrode lines, a plurality of data lines and a plurality of heating wirings which are at least in a display region of the display panel, wherein the plurality of gate electrode lines extends along a first direction and is arranged along a second direction; the plurality of data lines extends along the second direction and is arranged along the first direction; the first direction intersects the second direction; and the display panel further includes a non-display region at least partially surrounding the display region;

a control chip, in the non-display region on a first side of the display panel, wherein the control chip is at least electrically connected to a data line of the plurality of data lines; and along the second direction, the first side is adjacent to the display region;

a heating drive element, in the non-display region on the first side, wherein the heating drive element is electrically connected to a heating wiring of the plurality of heating wirings through a heating bus; and a gate drive element, in the non-display region on a second side of the display panel, wherein the second side is adjacent to the first side; and the gate drive element is electrically connected to a gate electrode line of the plurality of gate electrode lines and electrically connected to the control chip through a first lead, wherein:

along a third direction, the first lead and the heating bus are at least partially overlapped with each other to form an overlapped region; in the overlapped region, one of the first lead and the heating bus is hollowed out; and the third direction is perpendicular to a plane of the substrate.

20. The display panel according to claim 19, wherein:
in the overlapped region, one of the first lead and the heating bus includes a plurality of sub-wirings connected in parallel, or one of the first lead and the heating bus is a grid shape or a comb shape.

21. A display apparatus, comprising: a display panel according to claim 1.

22. The display apparatus according to claim 21, the display panel further includes:

a flexible circuit board, wherein the flexible circuit board includes a heating line electrically connected to the heating drive element and a signal line electrically connected to the gate drive element; along a direction perpendicular to the flexible circuit board, the heating line is at least partially overlapped with the signal line; and at an overlapped position, the heating line and the signal line are separated by at least two insulating layers.

23. The display apparatus according to claim 22, wherein:
the signal line includes a first signal line and a second signal line which are disposed in a same layer as the heating line and includes a third signal line disposed in a different layer from the heating line; along the direction perpendicular to the flexible circuit board, the third signal line is overlapped with the heating line; and a same third signal line is electrically connected to the first signal line and the second signal line through different connection holes, respectively.

* * * * *